(12) United States Patent
Neudeck et al.

(10) Patent No.: US 6,783,592 B2
(45) Date of Patent: Aug. 31, 2004

(54) LATERAL MOVEMENT OF SCREW DISLOCATIONS DURING HOMOEPITAXIAL GROWTH AND DEVICES YIELDED THEREFROM FREE OF THE DETRIMENTAL EFFECTS OF SCREW DISLOCATIONS

(75) Inventors: Philip G. Neudeck, Ohmsted Falls, OH (US); J. Anthony Powell, North Ohmsted, OH (US)

(73) Assignee: The United States of America as represented by the Administrator of National Aeronautics and Space Administration, Washington, DC (US)

( * ) Notice: Subject to any disclaimer, the term of this patent is extended or adjusted under 35 U.S.C. 154(b) by 153 days.

(21) Appl. No.: 10/268,749

(22) Filed: Oct. 10, 2002

(65) Prior Publication Data

US 2004/0069212 A1 Apr. 15, 2004

(51) Int. Cl.[7] .......................... C30B 25/02; C30B 25/04
(52) U.S. Cl. .......................... 117/97; 117/84; 117/109; 117/951; 438/478; 438/481; 438/758
(58) Field of Search .......................... 117/84, 97, 109, 117/951; 438/478, 481, 758

(56) References Cited

U.S. PATENT DOCUMENTS

| | | | |
|---|---|---|---|
| 3,962,716 A | * | 6/1976 | Petroff et al. |
| 4,088,515 A | * | 5/1978 | Blakeslee et al. |
| 5,248,385 A | * | 9/1993 | Powell |
| 5,279,701 A | * | 1/1994 | Shigeta et al. |
| 5,285,086 A | * | 2/1994 | Fitzgerald, Jr. |
| 5,363,800 A | * | 11/1994 | Larkin et al. |
| 5,656,540 A | * | 8/1997 | Nomura et al. |
| 5,753,038 A | * | 5/1998 | Vichr et al. |
| 5,915,194 A | * | 6/1999 | Powell et al. |
| 5,958,132 A | * | 9/1999 | Takahashi et al. |
| 5,981,400 A | * | 11/1999 | Lo |
| 6,051,849 A | * | 4/2000 | Davis et al. |
| 6,100,111 A | * | 8/2000 | Konstantinov |
| 6,163,557 A | * | 12/2000 | Dunnrowicz et al. |
| 6,165,874 A | * | 12/2000 | Powell et al. |
| 6,252,261 B1 | * | 6/2001 | Usui et al. |
| 6,255,198 B1 | * | 7/2001 | Linthicum et al. |
| 6,261,929 B1 | * | 7/2001 | Gehrke et al. |
| 6,285,696 B1 | * | 9/2001 | Bour et al. |
| 6,316,785 B1 | * | 11/2001 | Nunoue et al. |
| 6,326,638 B1 | | 12/2001 | Kamiyama et al. |

OTHER PUBLICATIONS

J. A. Powell, Semiconductor Interfaces; Property and Applications, edited by Zhe Chuan Feng, published in Institute of Physics Publishing Bristol and Philadelphia, Chapter 11.

P.G. Neudeck, The VLSI Handbook edited by Wai–Kai Chen, published by CRC Press LLC of Baton Raton Florida, Chapter 6 thereof.

(List continued on next page.)

*Primary Examiner*—Felisa Hiteshew
(74) *Attorney, Agent, or Firm*—Kent N. Stone; John P. McMahon

(57) ABSTRACT

The present invention is related to a method that enables and improves wide bandgap homoepitaxial layers to be grown on axis single crystal substrates, particularly SiC. The lateral positions of the screw dislocations in epitaxial layers are predetermined instead of random, which allows devices to be reproducibly patterned to avoid performance degrading crystal defects normally created by screw dislocations.

72 Claims, 18 Drawing Sheets

OTHER PUBLICATIONS

P.G. Neudeck et al, Performance Limiting Micropipe Defects in Silicon Carbide Wafers, published in the IEEE Electron Device Letters, vol. 15, No. 2, Feb. 1994.

P.G. Neudeck et al, Study of Bulk and elementary Screw Dislocation Assisted Reverse–Breakdown in Low–Voltage (<250V) 4H–SiC P 'n Junction Diodes—Part I : DC Properties published in the IEEE Transactions on Electronic Devices, vol. 46, No. 3 Mar. 1999.

M. Dudley et al., Quantitative Analysis of Screw Dislocations in 6H–SiC Single Crystals, published in the technical Journal II Nuova Cimento, vol. 19 D, No. 2–4, pp 153–164.

P.G. Neudeck, Enlargement of Step–Free SiC Surfaces by Homoepctaxial Web Growth of Thin SiC Contilevers, published in Journal of Applied Physics, vol. 92, No. 5, pp. 2391–2400, 2002.

* cited by examiner

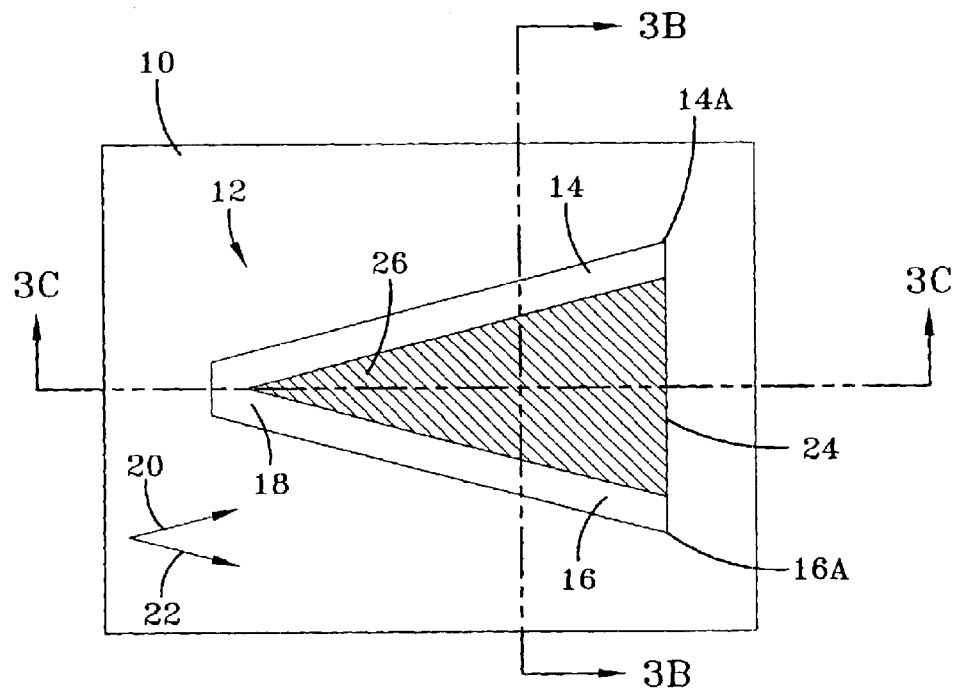
FIG-3A
PRIOR ART
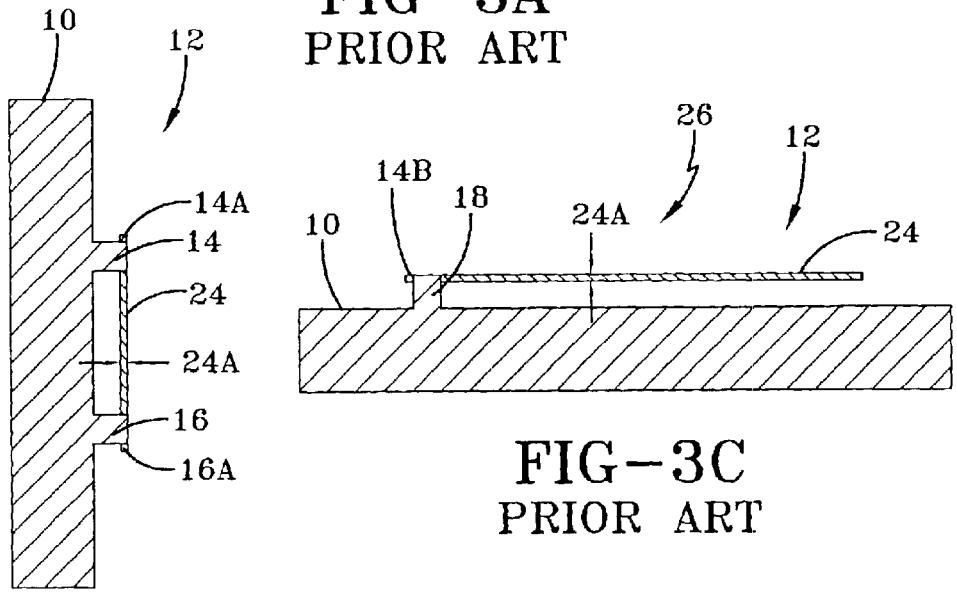
FIG-3B
PRIOR ART
FIG-3C
PRIOR ART

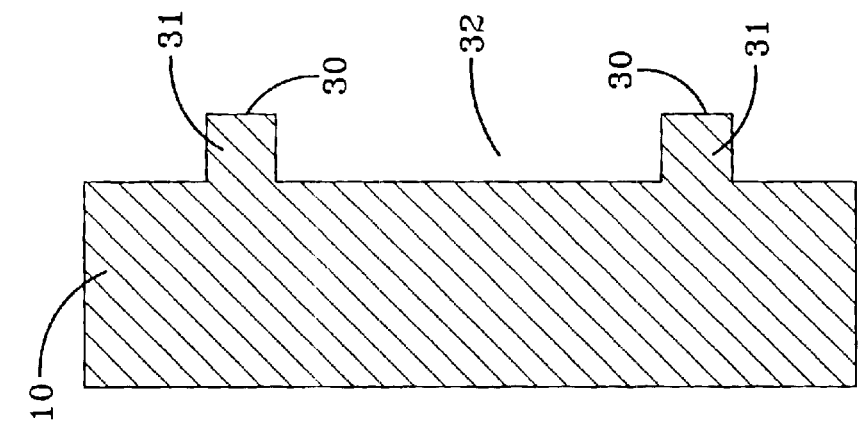
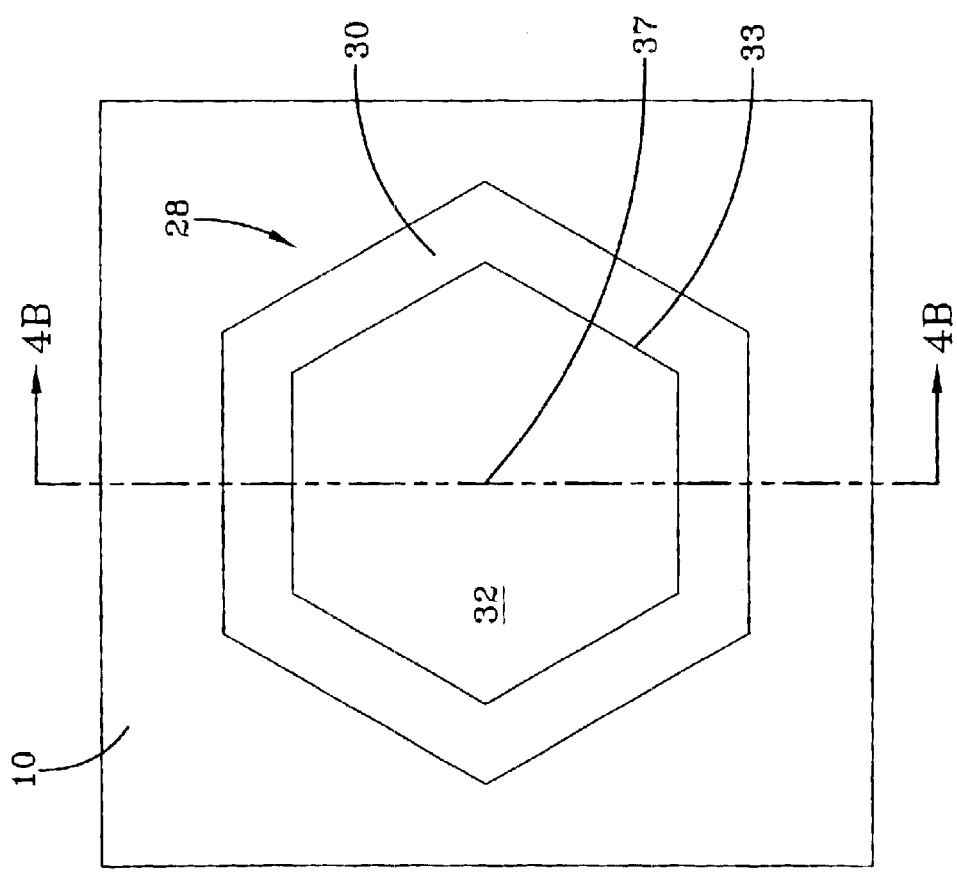
FIG-4B
FIG-4A

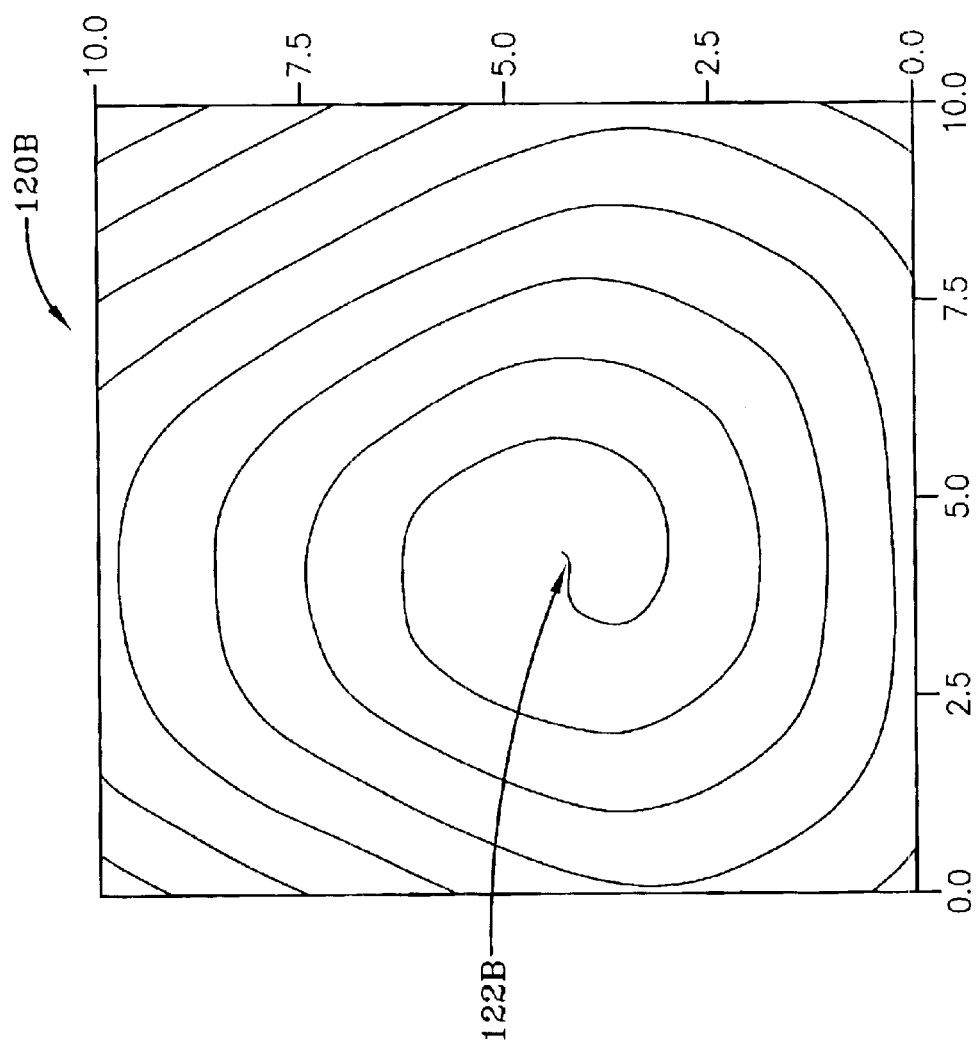

LATERAL MOVEMENT OF SCREW DISLOCATIONS DURING HOMOEPITAXIAL GROWTH AND DEVICES YIELDED THEREFROM FREE OF THE DETRIMENTAL EFFECTS OF SCREW DISLOCATIONS

CROSS-REFERENCE TO RELATED APPLICATION

This invention is related to U.S. patent application Ser. No. 09/776,998 ('998) filed Feb. 7, 2001.

ORIGIN OF THE INVENTION

The invention described herein was made by employees of the United States Government and may be used by or for the Government for governmental purposes without payment of any royalties thereon or therefor.

FIELD OF THE INVENTION

The invention relates to methods which provide for structures and techniques for the fabrication of wide bandgap semiconductor devices that are free of the effects of screw dislocations in the crystal substrate thereof. More particularly, the screw dislocations in the substrate crystal are displaced to predetermined locations so as to essentially eliminate the detrimental effects of the screw dislocations normally occurring in an epitaxial layer used in the formation of the wide bandgap semiconductor devices. In particular, the invention discloses methods for moving c-axis screw dislocations in SiC and GaN substrate regions to predetermined lateral locations using homoepitaxial growth.

BACKGROUND OF THE INVENTION

The material properties of silicon carbide (SiC), gallium nitride (GaN), and other wide bandgap semiconductors are well known to be outstanding for solid-state power device applications that would enable more efficient power management and conversion systems and large system benefits that are not possible using today's well-commercialized silicon solid-state devices. However, the performance and the commercialization of high-electric-field SiC power devices is well known to be severely limited by the presence of c-axis screw dislocations in the SiC substrate that, until now, have propagated into the epitaxial layers making up the SiC devices. More particularly, as described in chapter 6 of the VLSI Handbook edited by Wai-Kai Chen published by CRC Press LCC of Boco Raton, Fla., herein incorporated by reference, the best performing SiC high field devices have always been those that are small enough to fit between screw dislocations, since device performance degrades as the sizes of the devices increase to encompass more and more screw dislocations. Screw dislocations in SiC are further described in the technical paper presented at the 3$^{rd}$ European Symposium on X-ray Topography and High-Resolution X-ray Diffraction (X-TOP '96), 22–24 Apr. 1996, Palermo, Italy, entitled "Quantitative Analysis of Screw Dislocation in 6H—SiC Single Crystals", by M. Dudley et al, and also herein incorporated by reference. This technical article was published in the technical journal II Nuovo Cimento, Vol. 19D, No. 2–4, pp 153–164. Screw dislocations are also described in chapter 11 of the technical book entitled "Semiconductor Interfaces, Microstructures and Devices: Properties and Applications" edited by Zhe Chuan Feng and published by Institute of Physics Publishing, Bristol and Philadelphia, herein also incorporated by reference.

All commercial SiC wafers, serving as substrates, to date, contain screw dislocations distributed randomly across the substrate in average densities that are of the order of thousands per square centimeter of wafer area. All of these screw dislocations present in the wafer propagate into the epitaxial layers making up the high field devices. These screw dislocation defects are difficult to observe, and it is nearly impossible to readily predict their locations on any given wafer so that the device being fabricated cannot practically be patterned and/or placed to avoid the vast majority of these defects. This greatly harms the yield, performance, and commercialization of high beneficial SiC high-field power switching devices. It is desired to reduce or even eliminate the detrimental performance effects of screw dislocations in SiC crystals and devices.

OBJECTS OF THE INVENTION

It is a primary object of the present invention to provide a method that eliminates or reduces the detrimental effects of the screw dislocations associated with wide bandgap semiconductor substrates, particularly SiC, and involved in epitaxial layer growth and the operation of devices on wide bandgap crystal substrates.

It is another object of the present invention to displace the screw dislocations to predetermined locations that will not interfere with the desired epitaxial layer growth and device fabrication and the operation of devices on wide bandgap semiconductor substrates, particularly SiC.

Also, it is another object of the present invention to reduce the total number of screw dislocations that propagate into the epitaxial film growth on wide bandgap semiconductor substrates, particularly SiC.

It is a further object of the present invention to provide high-field wide bandgap semiconductor devices for high power conversion that do not suffer the performance degradations commonly caused by screw dislocations.

It is another object of the present invention to provide for improved alpha-SiC homoepitaxial layers to be grown on a c-axis alpha SiC substrate.

It is another object of the present invention to provide for improved seed crystals for the growth of SiC substrate boules, whereby the number of screw dislocations in the boule is reduced and/or the locations of screw dislocations are predetermined.

It is another object of the present invention to provide a more optimal distribution of screw dislocations for the growth of SiC substrate boules, whereby the average distance between screw dislocation growth stepsources can be optimized according to boule growth conditions.

Moreover, it is an object of the present invention to control the lateral position of the screw dislocations involved in the growth of epitaxial layers so as to allow wide bandgap semiconductor devices to be reproducibly patterned so as to avoid performance-degrading crystal defects normally caused by screw dislocations.

Furthermore, it is an object of the present invention to provide improved lateral epitaxial overgrowth (LEO) techniques for materials, such as Group III-nitride materials.

SUMMARY OF THE INVENTION

The present invention is directed to various methods that displace the screw dislocations to predetermined lateral locations corresponding to web convergence points of lateral growth of an epitaxial layer so that the detrimental effects of the screw dislocations are essentially eliminated from the epitaxial layers formed for wide bandgap semiconductor devices.

In one embodiment the present invention provides a method for growing at least one single crystal layer on a selected single crystal substrate having an average density of replicating nonremovable stepsource dislocations, wherein the at least one single crystal layer contains at least one replicating nonremovable stepsource dislocation confined to selected lateral point locations. The method comprises the steps of: (a) choosing a single crystal substrate material which exhibits a property that the material therein contains at least one growth plane orientation whereby under selected growth conditions the growth rate due to step-flow growth is greater than at least one hundred (100) times a growth rate due to growth involving two-dimensional nucleation; (b) preparing a planar first growth surface on the single crystal substrate that is parallel to within a predetermined angle relative to a selected crystal plane of the single crystal substrate; (c) removing material in the first growth surface so as to define at least one selected separated second growth surface with top surface area that is selected to be less than twice the inverse of said average density of replicating nonremovable stepsource dislocations in the single crystal substrate and with border shape selected to have at least one enclosed hollow region, the selected separated second growth surface defining a cumulative hollow region area enclosed by at least one interior border shape selected to obtain lateral coalescence at a selected lateral point location, wherein said cumulative hollow region area is selected to be greater than half the inverse of the average density of replicating nonremovable stepsource dislocations in the single crystal substrate; (d) treating the at least one selected separated second growth surface so as to remove any removable sources of unwanted crystal nucleation and any removable sources of steps therein; (e) depositing a homoepitaxial film on the at least one separated second growth surface under selected conditions so as to provide a step-flow growth while suppressing two-dimensional nucleation; (f) continuing the deposition of said homoepitaxial film so that said step-flow growth results and produces at least one lateral cantilevered web structure growing laterally toward the interior of said at least one enclosed hollow region; (g) continuing the deposition of the homoepitaxial film until the at least one lateral cantilevered web structure completes its lateral coalescence at a selected lateral point location thereby completely covering the at least one enclosed hollow region with at least one complete crystal roof forming at least one selected separated third growth surface of desired size and shape; and (h) continuing the deposition of the homoepitaxial film for a selected third time period until homoepitaxial film of desired vertical thickness on top of the selected separated third growth surface is achieved.

BRIEF DESCRIPTION OF THE DRAWINGS

FIG. 1 is a prior art illustration composed of FIGS. 1A and 1B, wherein

FIG. 3 is a prior art illustration composed of FIGS. 3A, 3B, and 3C, wherein FIG. 3A shows the completed growth of the lateral web cantilevers of the homoepitaxial film spanning between the ledges of the non-closed shaped mesa;

FIG. 3B is a cross-section taken along line 3B—3B of FIG. 3A, and FIG. 3C is a cross-section taken along line 3C—3C of FIG. 3A.

FIG. 4 illustrates a hexagonal closed shape (O-shape) growth mesa etched into the surface of a substrate, wherein FIG. 4A is a top view thereof and FIG. 4B is a side view thereof taken along line 4B—4B of FIG. 4A.

FIG. 5 is an illustration of a partially webbed homoepitaxial film growth spanning between the ledges of an O-shape mesa, wherein

FIG. 6 is composed of FIGS. 6A and 6B and illustrate a fully grown homoepitaxial film covering the O-shape closed mesa of FIG. 5A and providing a roof thereof, wherein

FIG. 7 is composed of FIGS. 7A, 7B, 7C, 7D, 7E, 7F and 7G, wherein

FIG. 8 is composed of FIGS. 8A and 8B, both illustrating a partially grown epitaxial film comprised of lateral cantilevers, wherein

FIG. 9 is composed of FIGS. 9A and 9B, wherein

FIG. 10 is composed of FIGS. 10A and 10B and illustrates a roof closure of the cantilever film resulting from hollow mesa enclosure of two opposite sign substrate elementary screw dislocations, that is, a left-handed and a right-handed elementary screw dislocation, wherein

FIG. 11 is composed of FIGS. 11A and 11B and illustrates a roof closure of the cantilever film resulting from hollow mesa enclosure of two-like sign substrate elementary screw dislocations, wherein

FIG. 16 illustrates an Atomic Force Microscope (AFM) image of an elementary (1 nm measured step-height) closed-core 4H—SiC screw dislocation detected on the center of one of the webbed roofs of the semiconductor device of FIG. 15.

DETAILED DESCRIPTION OF THE PREFERRED EMBODIMENTS

Figure 1A:
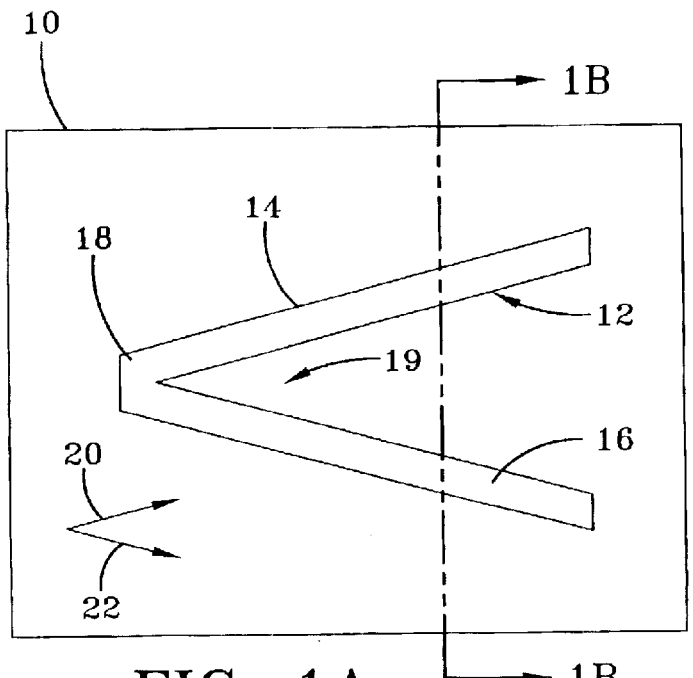
FIG. 1A is a top view showing a pre-growth region comprising a mesa having a non-closed shape.

The present invention is related to a product by process wherein the products are wide bandgap devices, particularly silicon carbide (SiC) devices, having a substrate with a crystallographic c-axis and having desirable performance characteristics. The method of the present invention enables or anticipates being able to laterally move (or place) screw dislocations that are randomly located across the substrate, to predetermined lateral locations in a homoepitaxial layer so as to better avoid adverse effects of the screw dislocations.

In general, in one embodiment the present invention provides a method for growing at least one single crystal layer on a selected single crystal substrate having an average density of replicating nonremovable stepsource dislocations, wherein the at least one single crystal layer contains at least one replicating nonremovable stepsource dislocations that is confined to selected lateral point locations. The method comprising the steps of: (a) choosing a single crystal substrate material which exhibits a property that the material contains at least one growth plane orientation, whereby under selected growth conditions the growth rate due to step flow growth is greater than at least one hundred (100) times a growth rate due to growth involving two-dimensional nucleation; (b) preparing a planar first growth surface on the single crystal substrate that is parallel to within a predetermined angle relative to a selected crystal plane of the single crystal substrate; (c) removing material in the first growth surface so as to define at least one selected separated second growth surface with top surface area that is selected to be less than twice the inverse of the average density of replicating nonremovable stepsource dislocations in the single crystal substrate and with a border shape selected to have at least one enclosed hollow region. The selected separated second growth surface has a cumulative hollow region area enclosed by at least one interior border shape selected to obtain lateral coalescence at the selected lateral point location, wherein the cumulative hollow region area is selected to be greater than half the inverse of the average density of replicating nonremovable stepsource dislocations in the single crystal substrate. The method further includes steps (d) treating the at least one selected separated second growth surface so as to remove any removable sources of unwanted crystal nucleation and any removable sources of steps therein; (e) depositing a homoepitaxial film on the at least one second separated growth surface under selected conditions so as to provide a step flow growth while suppressing two-dimensional nucleation; (f) continuing the deposition of said homoepitaxial film so that the step flow growth results and produces at least one lateral cantilevered web structure growing laterally toward the interior of the at least one enclosed hollow region; (g) continuing the deposition of the homoepitaxial film until the at least one lateral cantilevered web structure completes its lateral coalescence at a selected lateral location thereby completely covering the at least one enclosed hollow region with at least one complete crystal roof forming at least one selected separated third growth surface of desired size and shape; and (h) continuing the deposition of the homoepitaxial film until homoepitaxial film of desired vertical thickness on top of the selected separated third growth surface is achieved.

The different processes of the present invention are quite similar to the process described in the previously mentioned U.S. patent application Ser. No. '998. U.S. patent application Ser. No. '998, herein incorporated by reference, describes a process for growing atomically flat thin lateral webbed cantilevered structures starting from mesas patterned into substrates prior to homoepitaxial growth. The planar shapes of the pre-growth mesa patterns are important to realizing successful "webbed growth" in the U.S. patent application Ser. No. '998, wherein "open-ended" concave pre-growth shapes are emphasized, such as the "cross", "star", "V", "U", "tree", and multiple combinations thereof. The process for the V-shaped mesa associated with U.S. patent application Ser. No. '998 and related to the present invention is shown herein in FIGS. 1–3; however, it should be recognized that the present invention is associated with hollow closed shaped mesa and not the open V-shaped mesa.

Figure 13:
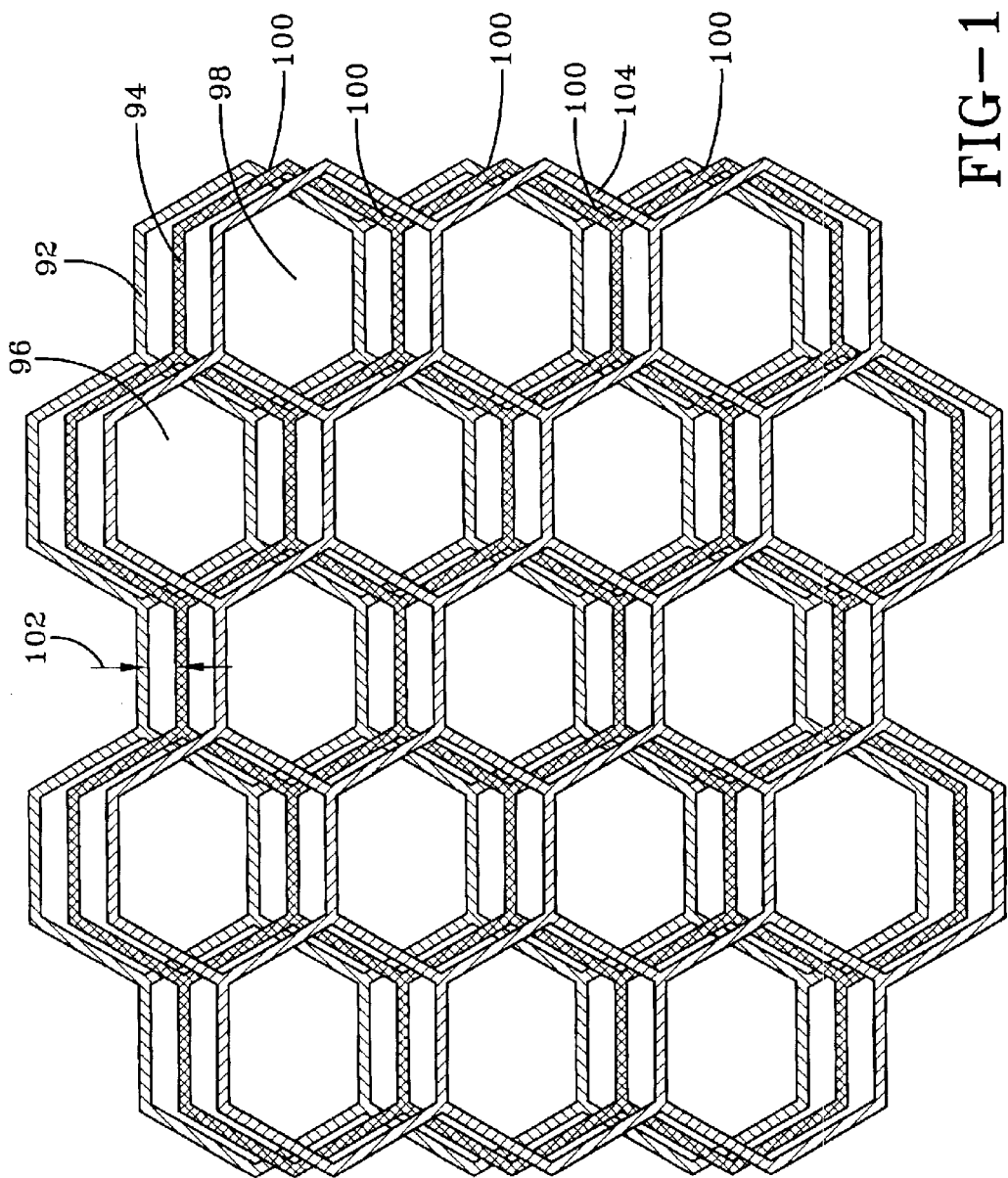
FIG. 13 illustrates a second growth surface of one embodiment of the present invention achieved by properly selecting and aligning said second growth surface of the present invention to the double-layer LEO selective growth seed pattern of FIG. 12.
Figure 14:
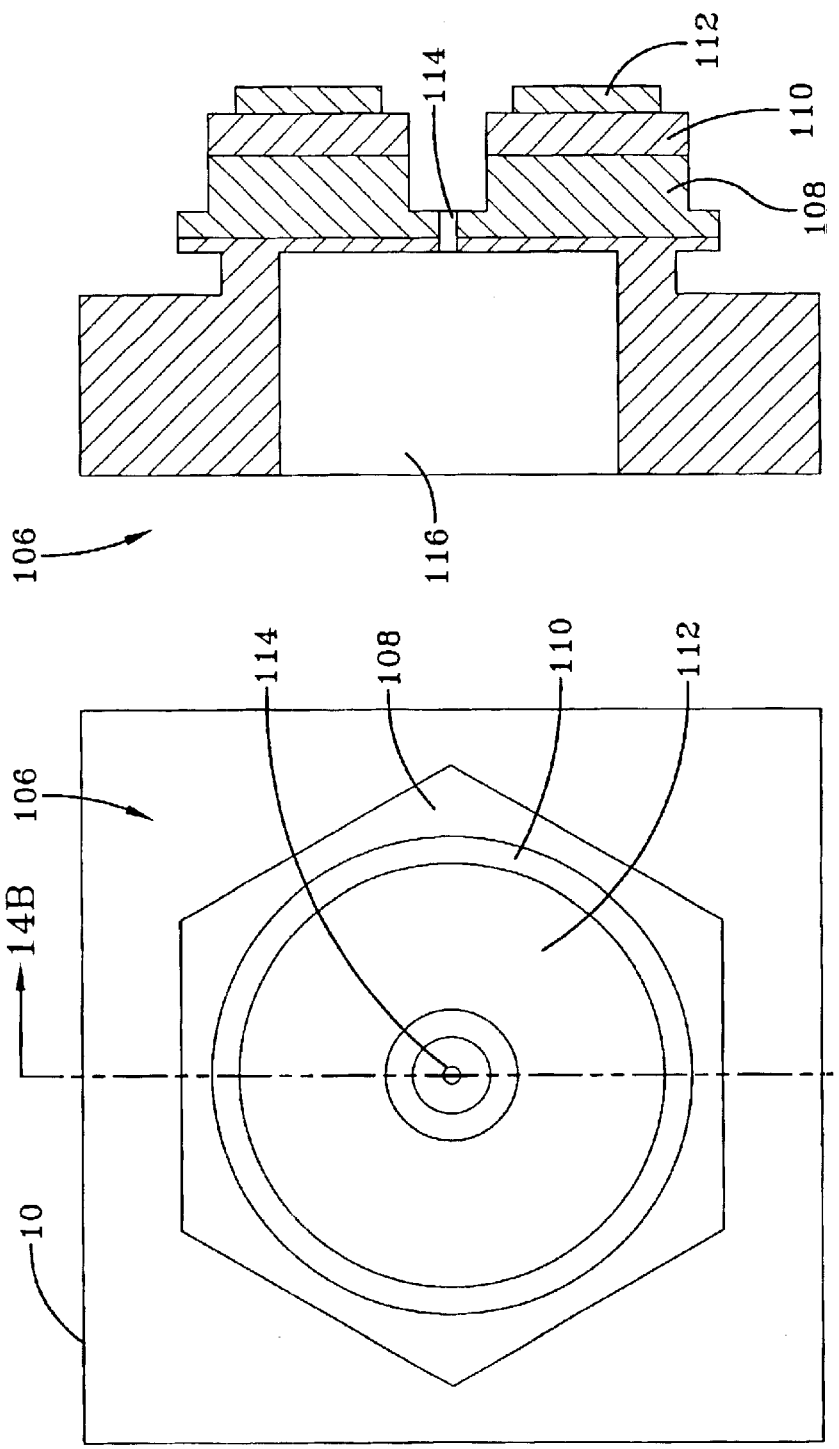
FIG. 14 is composed of FIGS. 14A and 14B that cumulatively illustrate a mesa-etched pn junction diode device patterned to avoid the detrimental effects of the epitaxial film screw dislocation with predetermined lateral location.
Figure 15:
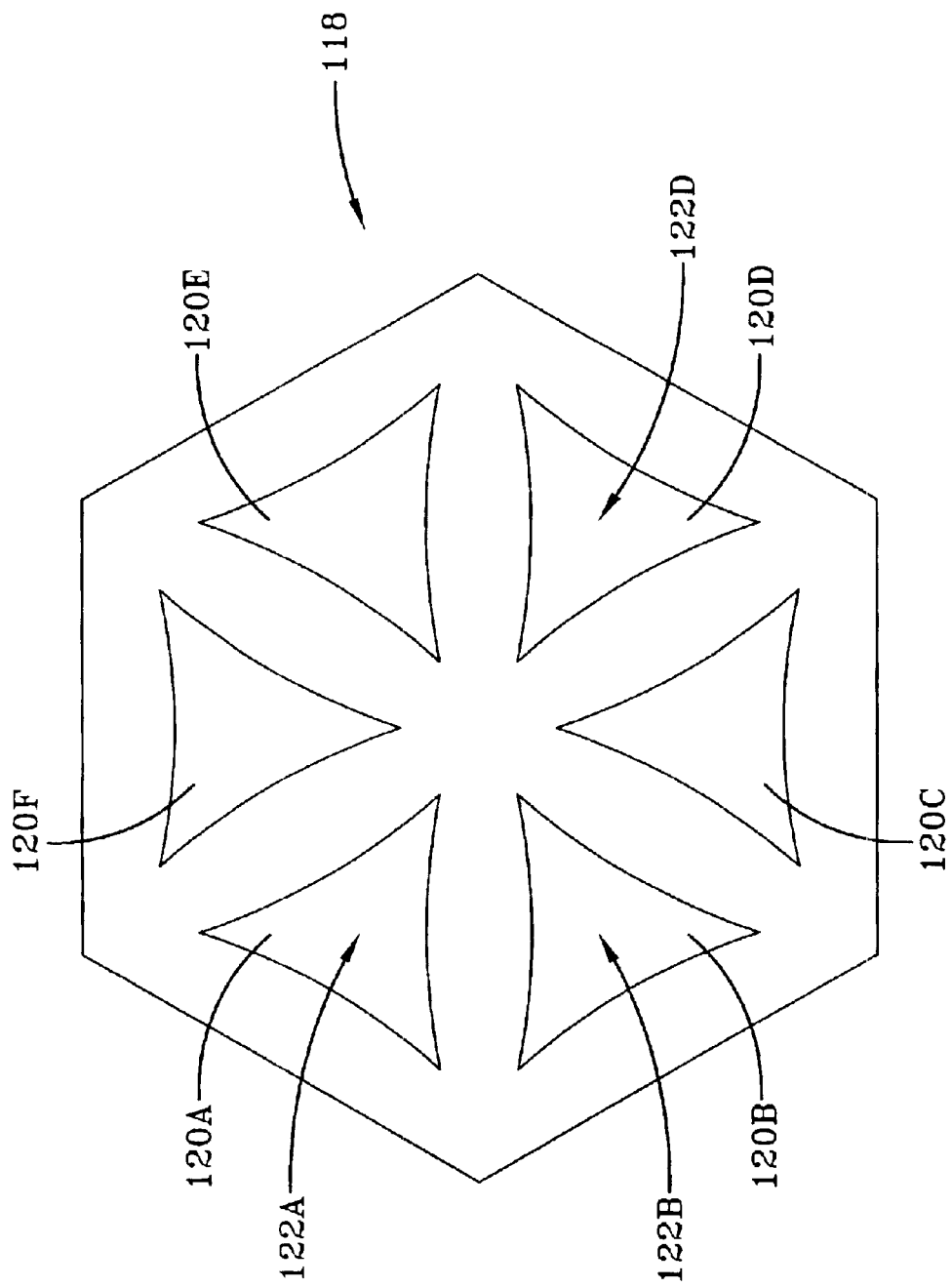
FIG. 15 illustrates a semiconductor device comprised of six closed shaped elements each having a triangular shape, and wherein the center point of three of the closed shaped elements corresponds to the location of the respective screw dislocations in the epitaxial film.

Except for the reference numbers, FIGS. 1, 2, and 3, herein are respectively the same as FIGS. 14, 15, and 16 of the U.S. patent application Ser. No. '998 and the teachings of U.S. patent application Ser. No. '998 are applicable to the present invention. For the sake of completion, the relevant portions of the disclosure of U.S. patent application applicable to FIGS. 14–16 are generally described herein with regard to FIGS. 1–3. However, again it should be understood that the complete teachings of U.S. patent application Ser. No. '998 are applicable to the processes of the present invention to be described herein with reference to FIGS. 1–16.

Figure 1B:
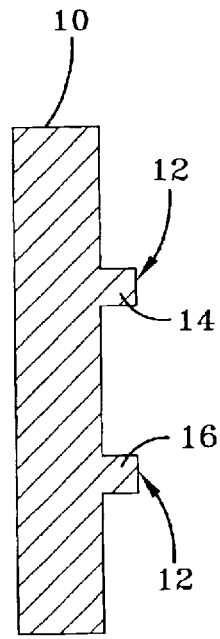
FIG. 1B is a cross-sectional view of the device of FIG. 1 taken along line 1B—1B of FIG. 1A.

FIG. 1 herein is composed of FIGS. 1A and 1B. FIG. 1A illustrates a single-crystal substrate 10 having a surface from which material is removed to form a selected second growth surface (or pregrowth mesa), such as 12, comprised of two branches 14 and 16 that are joined together at a root region 18. As will be further described, the single crystal substrate 10 is chosen to be of a material which exhibits a property that the material contains at least one growth plane orientation, whereby under selected growth conditions the growth rate due to step flow growth is greater than at least one hundred (100) times a growth rate due to growth involving two-dimensional nucleation.

Figure 2A:
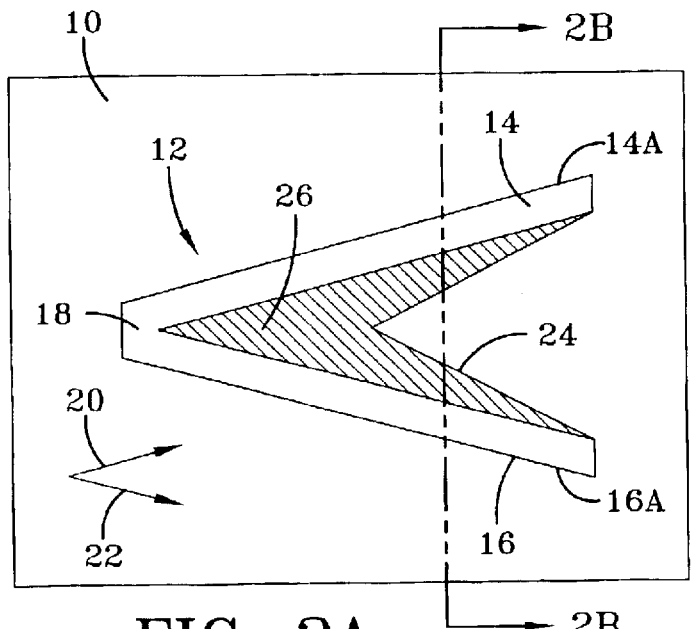
FIG. 2 is a prior art illustration composed of FIGS. 2A and 2B, which are respectively similar to FIGS. 1A and 1B except for the showing of the partial growth of a film comprising lateral web cantilevers and spanning between the concave portion of the non-closed shape mesa.

FIG. 1A, as well as FIGS. 2A and 3A to be described, illustrates directional arrows 20 and 22 associated with the respective branches shown therein and indicative of crystal vertex directions 20 and 22 that are defined and described in the '998 application. The removal of the material forms a mesa structure, such as with branches 14 and 16, which may be further described with reference to FIG. 1B, which is a view taken along line 1B—1B of FIG. 1A.

As seen in FIG. 1B, the mesa 12 (top surface) serving as a second growth surface comprised of the branches 14 and 16 is raised relative to the remaining substrate 10. The mesa 12 with branches 14 and 16 are sometimes referred to herein as ledges, especially with reference to the closed shaped mesas of the present invention. The second growth surface 12 has branches 14 and 16 that flow from the root region 18. The mesa 12, serving as the second growth surface, is designed to have a concave corner feature 19 which, as will be described in FIGS. 2 and 3, facilitates desired rapid formation of lateral webbed cantilever features. The cantilevered web growth of the present invention may be further described with reference to FIG. 2.

As more fully described in U.S. patent application Ser. No. '998, the selected separated second growth surface, that is mesa 12, is treated so as to remove any removable sources of unwanted crystal nucleation and any removable sources of new growth steps therein. The removal may be provided by a gaseous step flow etch and wherein the step flow etch is carried out in a growth etching system at a temperature greater than 1000° C., but less than 2000° C. and in a vapor selected from the group of vapors consisting of (1) hydrogen, (2) hydrogen plus hydrogen chloride, (3) and a mix of hydrogen with other gases selected from the group consisting of hydrocarbons, inert gases, and oxygen. Alternatively, the removal may be provided by a sublimation step flow etch process and wherein the step flow etch process is carried out in a sublimation growth/etching system at a temperature greater than 1800° C., but less than 2500° C. Descriptions of suitable growth etching systems and processes for SiC are well known to those skilled in the art, and some of which are described in the U.S. Pat. Nos. 5,248,385 and 5,915,194.

Figure 2B:
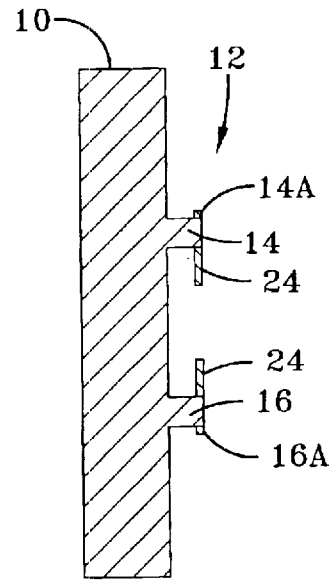

FIG. 2 is composed of FIGS. 2A and 2B, wherein FIG. 2A illustrates the structure of the device being formed part way through the step-flow epitaxial growth portion of the process. FIG. 2A illustrates branches 14 and 16 and root region 18 previously described with reference to FIG. 1. The branches 14 and 16 have growing cantilevers 14A, 16A, and 24 most clearly shown in FIG. 2B.

As seen in FIG. 2A, a cantilevered web growth 24, shown in cross hatch, is being formed and partially provides a third growth surface 26. It should be noted as used herein, when the cantilevered web growth is actually occurring the reference number 26 is used to signify a forming third growth surface rather than a third growth area. The extent of the cantilevered web growth 24 may be further described with reference to FIG. 2B, which is a cross-section view taken along line 2B—2B of FIG. 2A.

As seen in FIG. 2B, the non-concave edges 14A and 16A each has a cantilevered lip formed from lateral growth, but more importantly, the cantilevered web growth 24 along concave interior edges of the V-shape exceeds the lateral growth of the non-concave edges 14A and 16A, but has not yet fully spanned the concave region formed by branches 14 and 16 serving as ledges. The advantageous combination of two known growth mechanisms is believed responsible for the observed more rapid extension of web cantilevers of web growth 24 along the concave edges relative to the cantilevers along the non-concave edges 14A and 16A. It is well known by those skilled in the art that growth reactants diffusing around the surface of a crystal prefer to incorporate into internal corners and steps of a growing crystal. The concave vertex of the growing cantilever of web growth 24 is a preferential site for incorporation of reactant into the crystal, which, in turn, enables faster growth than that on the non-concave edges 14A and 16A. It is also well known by those skilled in the art that under selected growth conditions, growing crystals exhibit faceting phenomena, wherein the crystal prefers to grow in a given shape according to its crystal structure. With the selected pattern and orientation shown in FIG. 2A described previously, the internal portion of the cantilevered web will want to grow rapidly to form a $\{1\bar{1}00\}$ facet that spans the top of the V, as completely achieved in FIG. 3A, to be described. The completed spanning of branches 14 and 16 by the cantilevered web growth 24, may be further described with reference to FIG. 3.

FIG. 3 is composed of FIGS. 3A, 3B, and 3C with FIGS. 3A and 3B respectively similar to FIGS. 2A and 2B. FIG. 3A is different than FIG. 2A in that it shows that the cantilevered web growth 24 has completely spanned between the interior of the V shape between branches 14 and 16. The thickness of the completed web growth 24 may be further described with reference to FIG. 3B, which is a cross-sectional view taken along the line 3B—3B of FIG. 3A.

As seen in FIG. 3B, the web cantilevered growth 24 has a somewhat relatively uniform cantilevered thickness 24A and completely spans between the branches 14 and 16 to form the completed third growth surface 26 more clearly shown in FIG. 3A.

The thickness 24A extending between branches 14 and 16 is further illustrated in FIG. 3C which is a view taken along line 3C—3C of FIG. 3A. As seen in FIG. 3C, the cantilevered thickness 24A extends from the edge of the root region 18 outward. The branch 14 and also branch 16, not shown, has a further edge 14B having lateral growth similar to that of edge 14A of FIG. 3B.

It should now be appreciated that the practice of the present invention employing the process described in U.S. patent application Ser. No. '998 provides a method for producing homoepitaxial film having single crystal structure with cantilevered web features on a single-crystal substrate. The practice of the present invention that is primarily concerned with the elimination of the detrimental effects of screw dislocations discussed in the "Background" section herein, may be further described hereinafter with reference to FIGS. 4–16.

Unlike the teaching of U.S. patent application Ser. No. '998, the present invention selects hollow/closed pre-growth mesa shapes, such as those resembling an "O" shaped mesa or any other closed mesa shape, such as a hollow hexagonal shape or triangular shape, with a hollow interior to serve as a pre-growth region. In pursuit of our invention, it was discovered that a most interesting and useful new result occurred when the "web-growth" teachings of U.S. patent application Ser. No. '998 is used on hollow closed pre-growth mesa shapes, particularly when the hollow portion of the pre-growth mesa shape happens to enclose one or multiple screw dislocation defects from the SiC substrate. The benefits of the present invention may be better appreciated with reference to FIGS. 4–16. More particularly, the present invention may be more fully appreciated by first describing devices without screw dislocations, and then describing the present invention enabling beneficial devices even in spite of screw dislocations.

FIG. 4 is composed of FIGS. 4A and 4B and illustrates a hollow hexagonal ("O-shape") shape pre-growth mesa 28 etched into the wafer 10 surface. The pre-growth mesa 28 provides raised separated growth surface 30 on top of support structure 31 (shown in FIG. 4B) and encloses a hollow interior 32 that is shown in FIG. 4A as being hexagonal, but as will be further described hereinafter the shape may be selected from the group comprising circular, rectangular, hexagonal, triangular, and many other combinations thereof. The hollow interior 32 has enclosed border shape 33 defined by the interior border shape of the separated growth surface 30. The hollow hexagonal shaped pre-growth mesa 28 is further illustrated in FIG. 4B, which is a cross-sectional view taken along lines 4B—4B line in FIG. 4A. The hexagonal shaped pre-growth mesa 28 is advantageously free of any screw dislocations to be further described hereinafter with reference to FIG. 7. In particular, the raised pre-growth mesa 28 is selected to have relatively small top surface area compared to the mathematical inverse of the average substrate screw dislocation density in order to minimize the probability that the raised pre-growth mesa 28 contains a substrate screw dislocation. Specifically, in one embodiment, the single crystal substrate 10 used in the practice of the present invention has a known average density of nonremovable stepsource dislocations and the selected interior border shape of the top surface is chosen to provide a cumulative hollow region area, to be discussed hereinafter, that is greater than half the inverse of the average density of the replicating nonremovable stepsource dislocations (such as screw dislocations) of the single crystal substrate 10. This one embodiment provides for the first, second and third growth surfaces similar to that of U.S. patent application Ser. No. '998, but in addition thereto selects the separated second growth surface to define a cumulative hollow region area enclosed by at least one interior border shape selected to obtain lateral coalescence at a selected (i.e., predetermined) lateral location. As used herein, the term "cumulative hollow region area" is meant to refer to the sum of all hollow region areas defined by a single separated second growth surface. For example, with reference to FIG. 4A, the cumulative hollow region area is the area of the hollow region, designated by reference number 32, with the border 33 being defined by the interior of the raised separated growth surface 30. In some cases, a single second separated growth surface with multiple hollow regions can be created. For example, a pre-growth mesa 28 selected to be shaped like the number "8" would have a single raised growth region (i.e., single second separated growth surface 30), yet have two enclosed hollow regions. In such cases, a cumulative hollow region area is defined by the sum of the areas of the enclosed hollow regions, so that for the case of the 8-shaped mesa, the cumulative hollow region area would be the additive sum of the two hollow region areas. The outermost extent of the hollow region 32 defined by pre-growth mesa 28 is interior border 33 of the raised separated growth surface 30, also referred to herein as the interior border shape. For the pre-growth mesa 28 depicted in FIG. 4A, the smaller hexagon is the interior border shape 33. The cumulative hollow region area is selected to be greater than half the inverse of the average density of replicating nonremovable stepsource dislocation in the single crystal substrate 10, so that the hollow region area will be likely to contain at least one nonremovable stepsource dislocation, such as a screw dislocation, as will be illustrated in FIGS. 8–11, to be described. Preferably, the interior border shape 33 that defines the extent of hollow region 32 has a geometric center 37. For the case illustrated in FIG. 4, the interior border shape 33 is an equilateral hexagon which has a well-defined geometric center illustrated by reference number 37 in FIG. 4A. The geometric center of equilateral shapes is well-known in the art. The epitaxial layer growth related to the hollow hexagonal shape pre-growth mesa 28 may be further described with reference to FIG. 5, which is composed of FIGS. 5A and 5B, with FIG. 5B being a cross-sectional view taken along line 5B—5B of FIG. 5A.

Figure 5B:
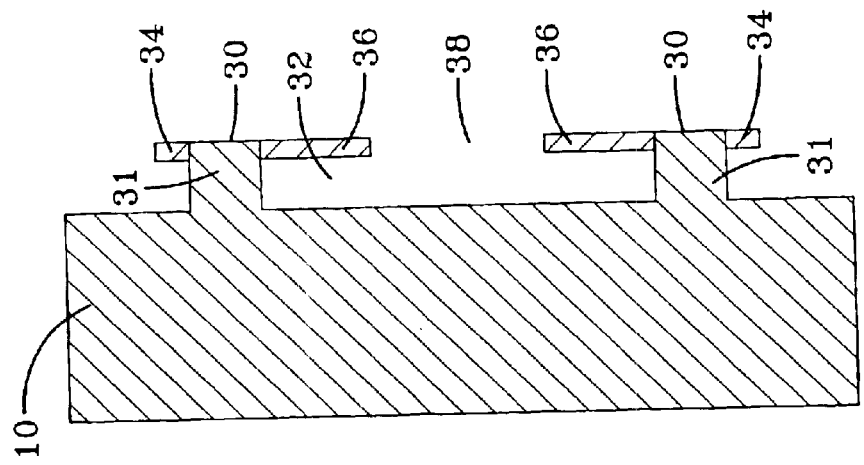
FIG. 5B is a side view thereof taken along line 5B—5B of FIG. 5A.

FIG. 5 illustrates the pre-growth mesa 28 as having the hexagonal shaped hollow region 32 (see FIG. 4), but in addition thereto, illustrates outer lateral cantilever growth region 34 and inner lateral web cantilever growth region 36, wherein inner growth 36 is incomplete leaving hole region 38. From FIG. 5B, it should be noted that inner lateral growth region 36 is starting to form a roof that will eventually cover the entire hexagonal-shaped hollow interior 32. The unfinished portion of the roof enclosure 38 is shown in FIG. 5. Further, it should be noted that the support structure 31 extends upward from the single crystal substrate 10. It should be noted that in our experiments, we have observed that in addition to the desired lateral growth of webbed cantilevers, some crystal deposition also occurs on mesa sidewalls and trench bottoms. Such deposition, relative to the process of U.S. patent application Ser. No. '998, is described in the technical article "Enlargement of Step-Free SiC Surfaces by Homoepitaxial Web Growth of Thin SiC Cantilevers," by P. G. Neudeck, J. A. Powell, G. M. Beheim, E. L. Benavage, P. B. Abel, A. J. Trunek, D. J. Spry, M. Dudley, and W. M. Vetter, published in Journal of Applied Physics, vol. 92, no. 5, pp. 2391–2400, 2002. For purposes of simplified illustration however, the deposition on the mesa sidewalls and trench bottoms is not depicted in FIG. 5, nor is it depicted in FIGS. 6–11, to be described.

When the process of U.S. patent application Ser. No. '998 is practiced on the closed pre-growth mesa 28 (where the starting mesa itself is free from screw dislocations) of FIG. 5, thin lateral cantilevers of an epitaxial film form from expanding regions 34 and 36 as depicted in FIG. 5 both inward 36 (toward the center of the hollow region 32) and outward 34 in a similar manner as previously described in FIGS. 1–3 for non-hollow open-shaped mesas, such as those having V shapes. When viewed from above, as seen in FIG. 5B, the center hollow portion of the hole region 38 grows smaller as the web growth cantilevers of region 36 grow inward from the pre-growth mesa 28. As seen in FIG. 5, the hollow region 32 is enclosed by at least one interior border shape that is selected to obtain lateral web cantilever film coalescence at a selected lateral location 37, completing the crystal roof 36A, to be described hereinafter. The interior web growth cantilevers that emanate from the concave mesa border, that is, those of region 36 grow faster for reasons described in U.S. patent application Ser. No. '998. The cantilevers of region 36 eventually completely grow together to form a complete roof 36A that "seals" the inside of the hollow region 32, forming a "micro-hut" structure (also referred to in the art as a "diaphragm" structure) with a "webbed cantilever roof" 36A created by interior cantilevers 36, to be further described hereinafter with reference to FIG. 6.

Figure 6B:
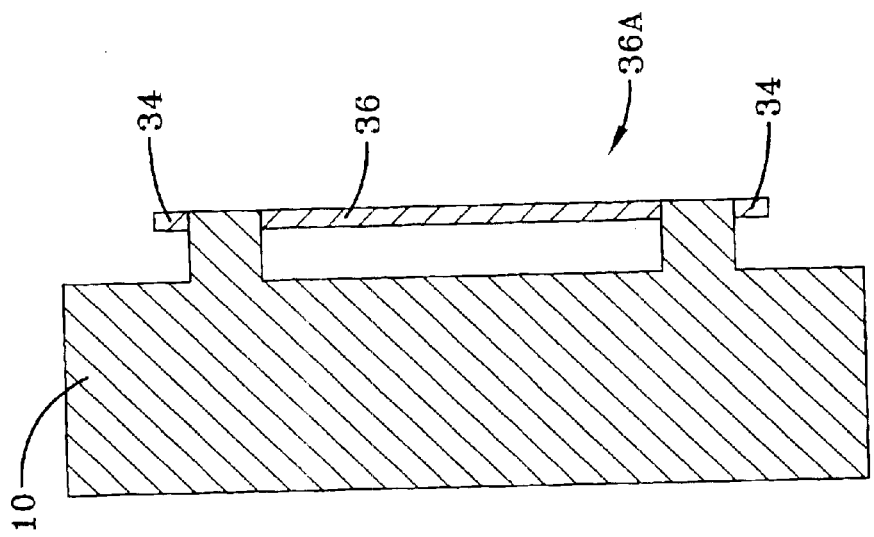
FIG. 6A is a top view thereof and FIG. 6B is a side view thereof taken along line 6A—6A of FIG. 6A.
Figure 6A:
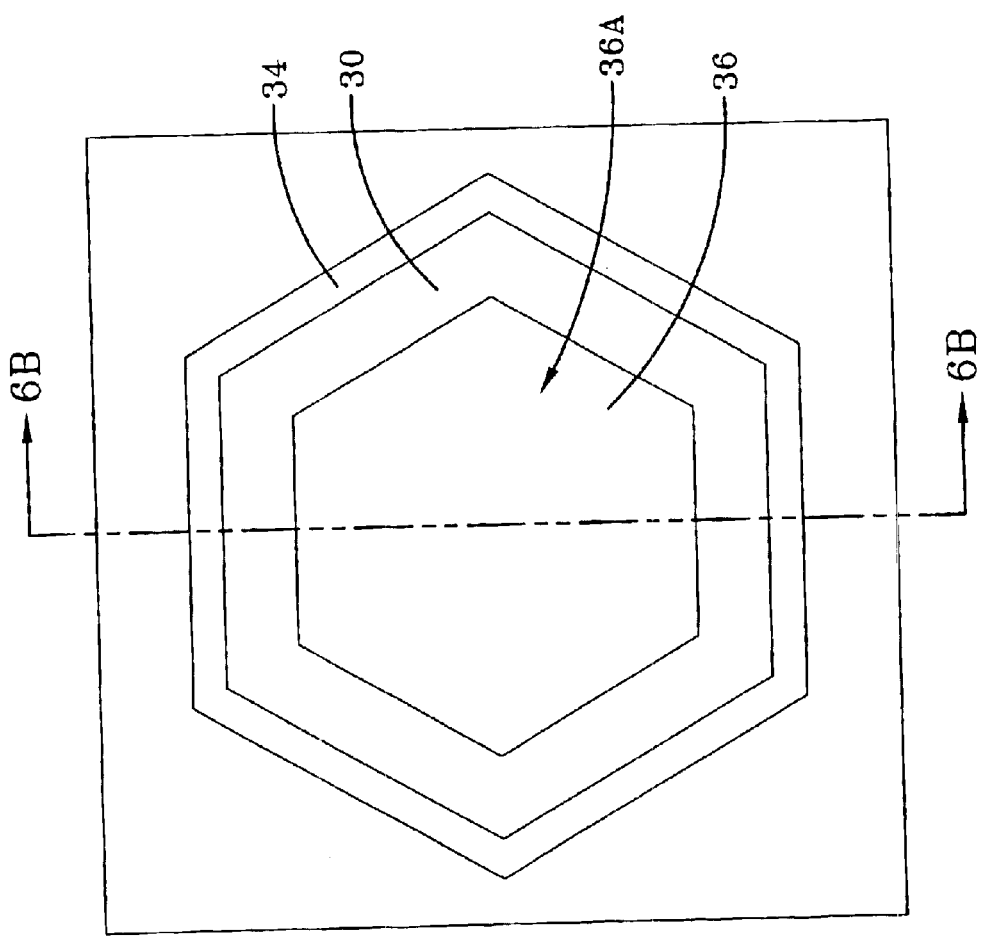

FIG. 6 is composed of FIGS. 6A and 6B, wherein FIG. 6B is a cross-sectional view taken along line 6B—6B of FIG. 6A. As seen in FIG. 6B, web growth cantilevers completely cover and form the roof 36A, which seals the inside of the hexagonal hollow region 32, and in turn, provides a micro-hut structure with a webbed cantilever roof 36A. The invention may be further described with reference to FIG. 7, which is composed of FIGS. 7A, 7B, 7C, 7D, 7E, 7F and 7G, wherein FIG. 7B is a cross-sectional view taken along line 7B—7B of FIG. 7A.

Figure 7B:
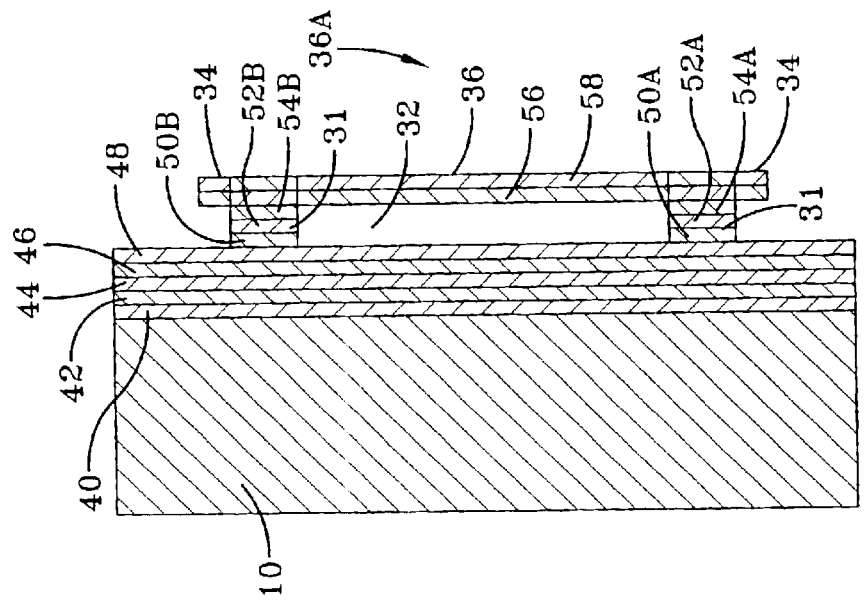
FIG. 7B is a side view thereof taken along line 7B—7B and illustrating crystal planes in the interior that are not disrupted by screw dislocations.
Figure 7A:
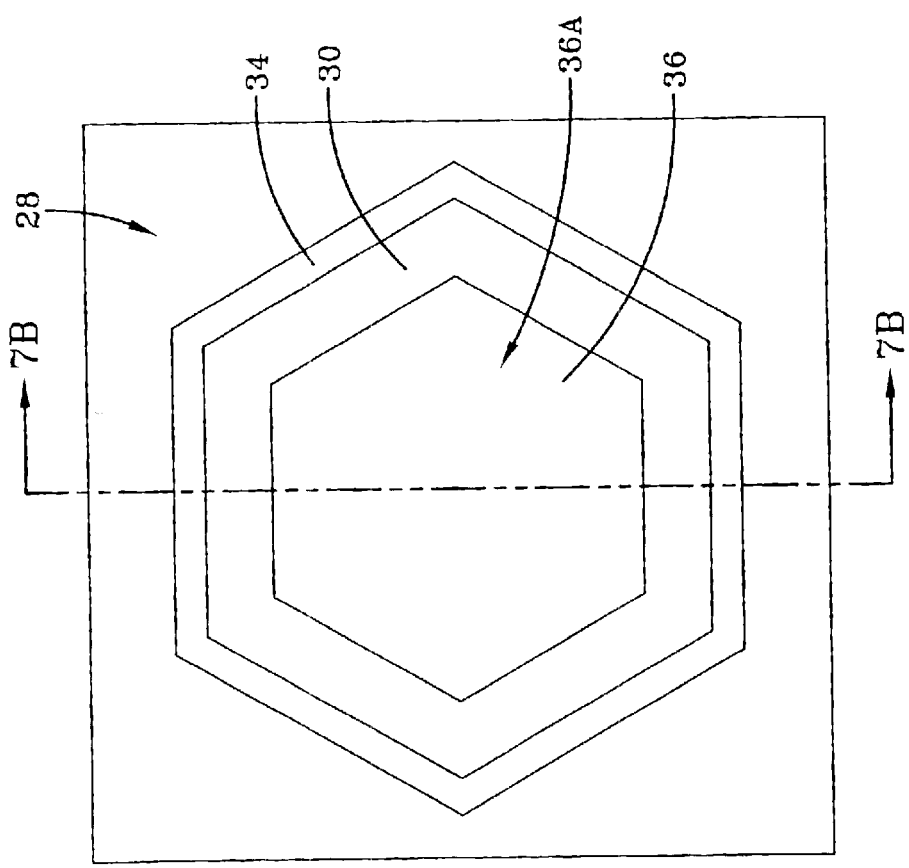
FIG. 7A is a top view showing a fully grown film comprising lateral cantilevers fully spanning between ledges of a hollow interior forming a roof.

FIG. 7A is similar to FIG. 6A, whereas FIG. 7B schematically illustrates in a simplified fashion the alignment of crystal planes in the structure. More particularly, FIG. 7B illustrates that the substrate 10 contains ideal crystal planes 40, 42, 44, 46, and 48, all of which are in alignment with each other and none of which suffer the disadvantages of screw dislocations because the pre-growth mesa 28 and enclosed hollow region 32 of FIG. 7 is free of screw dislocations. It should be noted that the thickness' of the crystal planes depicted in FIG. 7B, as well as FIGS. 8B, 9B, 10B and 11B to be described, is greatly exaggerated for purposes of illustration. In actuality, the crystal planes are on the order of nanometer thickness, while mesa features and cantilever thickness are on the order of micrometers in thickness. Also note, that crystal planes, as discussed in this application, are taken to be the thickness of the c-axis stacking repeat distance of the crystal polytype. For the case of 4H—SiC, the c-axis stacking repeat distance is 1.0 nm, while for 6H—SiC the c-axis stacking repeat distance is 1.5 nm. Thus, thousands of crystal planes are actually involved in the processes depicted in simplified form in cross-sections of FIGS. 7B, 8B, 9B, 10B and 11B. The support structure 31 illustrates the formation of ideal crystal planes 50, 52, and 54 all of which are in alignment with each other and none of which suffers from misalignment caused by screw dislocations. Furthermore, FIG. 7B illustrates that the regions 34, and 36 are integrated to form ideal crystal planes 56 and 58 neither of which suffers from screw dislocations. The ideal dislocation-free crystal planes 56 and 58 comprise the roof 36A.

The crystal planes 56 and 58 are cantilevered crystal planes that greatly extended laterally during the web growth process more fully described in U.S. patent application Ser. No. '998 and are free of displacement caused by dislocations. More particularly, because there are no substrate 10 screw dislocations enclosed by the hollow middle 32 of the pre-growth mesa 28, the crystal planes 40, 42, 44, 46, 48, 50 (comprised of crystal planes 50A and 50B), 52 (comprised of crystal planes 52A and 52B), 54 (comprised of crystal planes 54A and 54B), 56 and 58 all around the pre-growth mesa 28 line up perfectly, as depicted in FIG. 7B. More particularly, the crystal planes of the cantilever roof 56 and 58 are continuous and complete without discontinuity or disruption. Thus, an exact coalescence of the interior cantilevers 36 from all sides occurred, and a step-free top roof 36A comprised of regions 30, 34, and 36 is formed, consistent with the desired end result of U.S. patent application Ser. No. '998.

Screw dislocations are discussed in the previously incorporated by reference technical discussion of chapter 11 of the technical book entitled "Semiconductor Interfaces, Microstructures and Devices: Properties and Applications", and a particularly useful generic depiction of a screw dislocation's basic structure is given therein with reference to FIG. 7 thereof. As is known in the art, a cross-sectional view taken across the core of an elementary screw dislocation will show a half-stacking sequence discontinuity, similar to what is schematically depicted in the cross-sectional views of FIGS. 9B, 10B, and 11B, herein to be further described hereinafter.

Figure 7C:
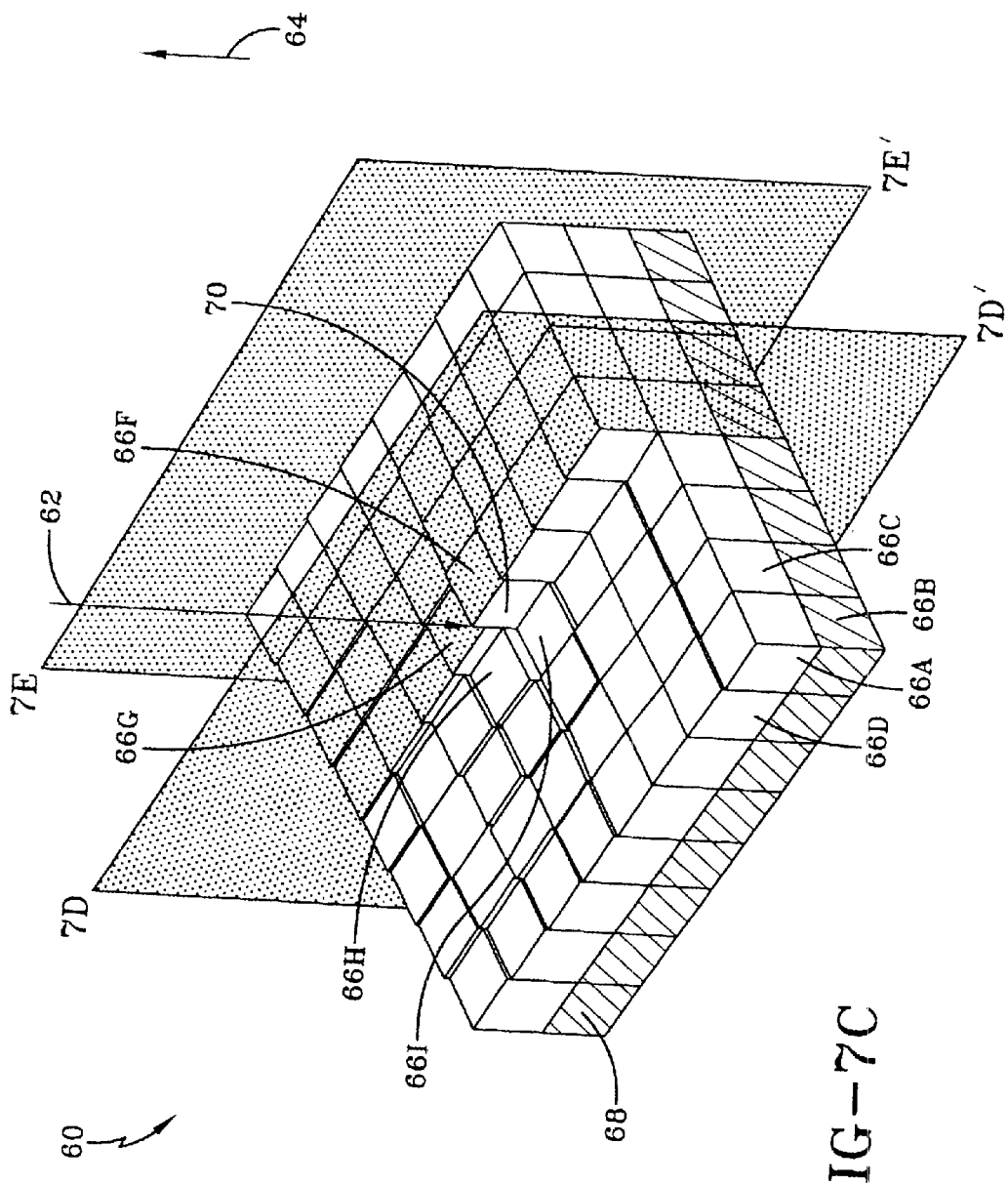
FIGS. 7C, 7D, 7E, 7F and 7G illustrate some of the primary characteristics of crystal screw dislocations associated with the practice of the present invention.
Figure 7E:
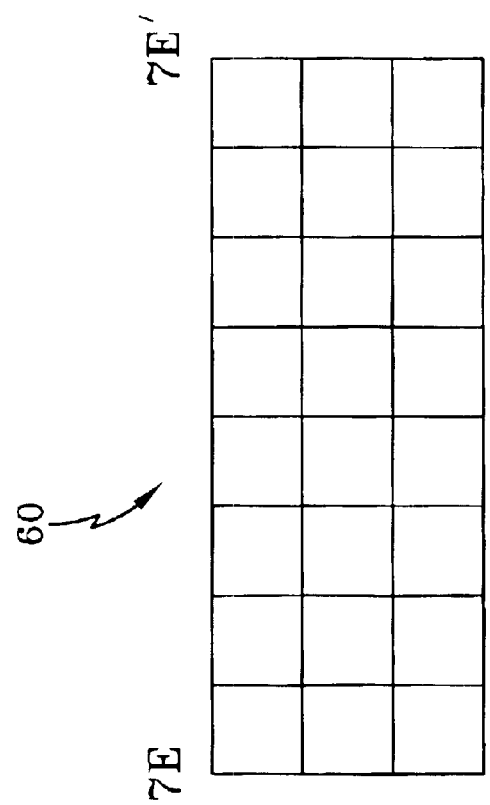
Figure 7D:
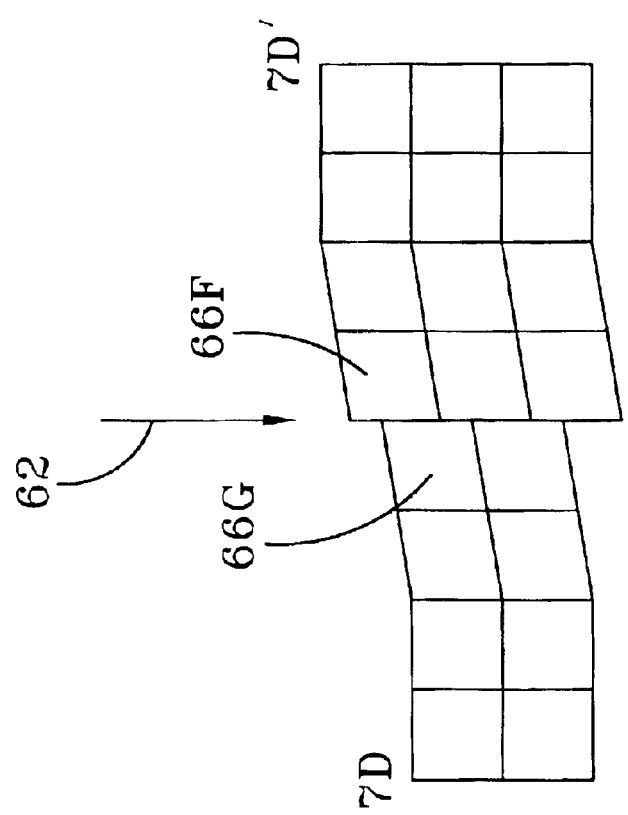

Some characteristics of crystal screw dislocations relevant to the present invention may be further described with reference to FIGS. 7C, 7D, 7E, 7F and 7G, wherein FIG. 7D is a view taken along plane 7D–7D' of FIG. 7C and FIG. 7E is a view taken along plane 7E–7E' of FIG. 7D.

A general simplified depiction of a small volume 60 of crystal that contains a screw dislocation 62 in the middle is shown in FIG. 7C. FIG. 7C is a modification of FIG. 7 of chapter 11 of the previously mentioned technical book entitled "Semiconductor Interfaces, Microstructures and Devices: Properties and Applications," wherein the model described therein was actually first put forth by F. C. Frank in 1949. FIG. 7C herein illustrates a stacking direction 64, also known as c-axis direction, of the crystal, such as that of the single crystal substrate 10, well known to those skilled in the art. FIG. 7C illustrates a plurality of blocks where each block, such as 66A, 66B, 66C and 66D, in FIG. 7 represents a unit cell of the crystal, also well known to those skilled in the art. An example of a crystal plane 68 with unit cell stacking height is denoted by the plane of the cross hatched blocks in FIG. 7C. The selected crystal plane 68 lies normal to the stacking direction 64. The screw dislocation 62 propagates through the crystal along the stacking direction 64.

It is well known to those skilled in the art that each unit cell block in the bulk of a crystal is surrounded by "nearest neighbor" unit cell blocks. In FIG. 7C for example, three of the nearest neighbor unit cell blocks of unit cell 66A are depicted in FIG. 7C as unit cell blocks 66B, 66C, and 66D. In a dislocation-free crystal, it is well known to those skilled in the art that all unit cell blocks line up perfectly (i.e., are in registration) with each other. Thus, there are no discontinuities between adjacent unit cells or crystal planes.

One definition of a crystal dislocation, known to those skilled in the art, is when adjacent unit cells do not line up, because they are "dislocated" from each other. The dislocation can physically be viewed as misalignment that exists between the crystal atoms and/or crystal unit cells. The screw dislocation 62 represented in FIG. 7C clearly exhibits adjacent unit cell blocks that are not well lined up with others. The screw dislocation 62 core in FIG. 7C intersects the surface of the small crystal volume 60 between the four unit cell blocks 66F, 66G, 66H and 66I on the depicted surface of the small crystal volume 60. All four unit cell blocks 66F, 66G, 66H, and 66I around the screw dislocation 62 are vertically misaligned with each other as seen in FIG. 7C. For example, across the middle of the screw dislocation 62, there is a vertical misalignment 70 of nearly a half unit cell height between cell blocks 66H and 66F due to the screw dislocation. The vertical misalignment can be further described with reference to FIG. 7D.

FIG. 7D is a cross-sectional view taken along the plane 7D–7D' of FIG. 7C that goes through the screw dislocation 62 that is illustrated in FIG. 7C. As illustrated in FIG. 7D, there is vertical misalignment at the screw dislocation 62 between unit cell blocks 66G and 66F across the screw dislocation 62. FIG. 7D also depicts the fact that there is local deformation and stress imposed on crystal unit cells (composed of crystal atoms) due to the screw dislocation 62. This stress forces atoms in the unit cell to deform away from their unstressed condition. In FIG. 7D, the deformation and stress is represented by the vertically deformed unit cell shapes, such as 66F and 66G.

The misalignment across the screw dislocation 62 between unit cell blocks 66F and 66H of FIG. 7C that are directly opposite each other diagonally separated by the screw dislocation 62 in FIG. 7C is close to a half unit cell height. Similarly, the misalignment of diagonally opposite blocks 66G and 66I is also close to half unit cell height. Thus, the cross-sectional vertical misalignment of crystal planes at the screw dislocation, as will be depicted in FIGS. 8B, 9B, 10B, and 11B to be described, is a half unit cell height.

It is important to note that the screw dislocation 62 does not cause significant misalignment along any direction perpendicular to the stacking direction 64. Thus, essentially all misalignment (i.e., crystal plane displacement) that occurs near or at the screw dislocation only occurs parallel to the direction of stacking 64. Far enough away from the core of a screw dislocation 62, such as denoted unit cell block 66A of FIG. 7C, each unit cell is well lined up with its nearest neighbor unit cell blocks. In fact, a cross-sectional view of a crystal far enough away from a screw dislocation 62 cannot distinguish the presence of a screw dislocation in the crystal. For example, a cross-sectional view taken along the plane 7E–7E' of FIG. 7C is shown in FIG. 7E. Even though the small crystal volume 60 contains a screw dislocation, this cross-section of FIG. 7E appears to be a perfect crystal as there are no appreciable misalignment of unit cell blocks. Furthermore, the unit cell deformation is essentially too small to be depicted in FIG. 7E. Thus, all detrimental effects of screw dislocations, such as degraded electrical properties previously noted, are confined to the immediate lateral vicinity of the screw dislocation where there is misalignment and strong local stress that arises from the screw dislocation. Therefore, as depicted in FIGS. 7C and 7D, deformation and displacement of crystal atoms (or crystal unit cells) associated with screw dislocations is confined to the region very close to the screw dislocation itself.

In the practice of this invention, the electrical properties are taken into account. More particularly, after the process of the invention forms a semiconductor device, to be further described, the semiconductor device is selected with a lateral pattern and alignment to avoid adverse electrical effects arising from the replicating nonremovable stepsource dislocation confined to the selected lateral locations. Preferably, the selected lateral pattern and alignment are selected such that an electric field at any replicating nonremovable stepsource dislocations during designed device operation is less than 80% of the electrical breakdown field of the homoepitaxial film making up the defect-free semiconductor device.

By selecting to fabricate the device so that the electric field is reduced around the predetermined screw dislocation location, the device will be able to function without defect assisted microplasma breakdown phenomenon. Such breakdown phenomenon, is described in the technical articles entitled "Performance Limiting Micropipe Defects is Silicon Carbide Wafers" and "Study of Bulk and Elementary Screw Dislocation Assisted Reverse Breakdown in Low Voltage (<250V) 4H—SiC p$^+$ n Junction Diodes Part I, DC Properties", both of P. G. Neudeck et al and respectively published in IEEE Electron Device Letters, Vol. 15, No. 2 February 1994 and IEEE Transactions on Electron Devices, Vol. 46, No. 3, March 1999. This breakdown is known in the art to be detrimental to SiC power device functionality and reliability. Similarly, it is also known in the art that excess current is often known to flow through dislocations during device operation, which also often leads to undesired device operating characteristics such a degraded device reliability and operating lifetime. Preferably, therefore, the selected lateral pattern and alignment of the device can be selected such that the current density at any nonremovable stepsource dislocations is less than 50% of the peak current density in the rest of the device. Many other benefits and particular implementations of being able to pattern a device around known predetermined locations to avoid screw dislocations will readily suggest themselves to those skilled in the art.

Figure 7F:
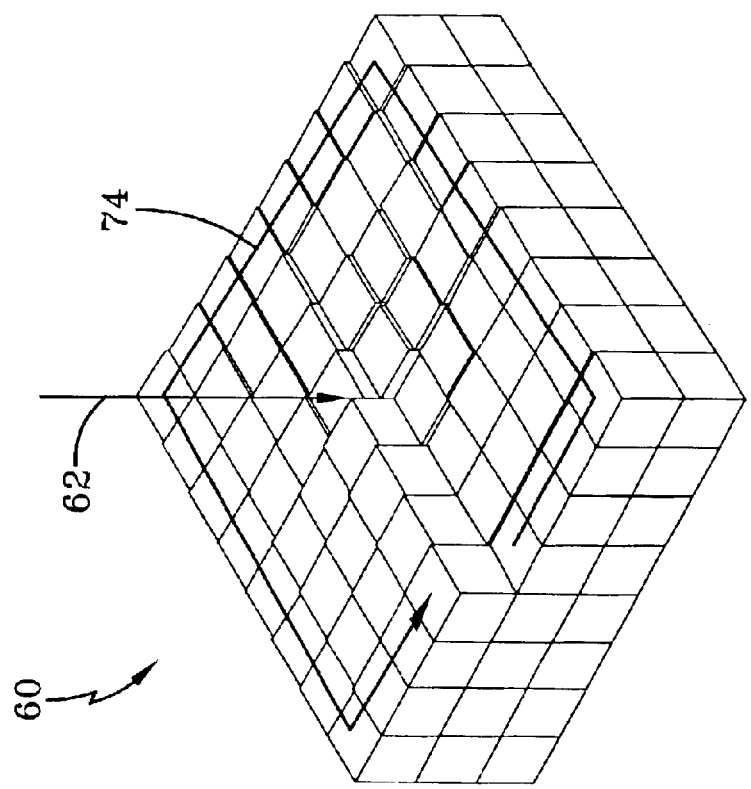
Figure 7G:
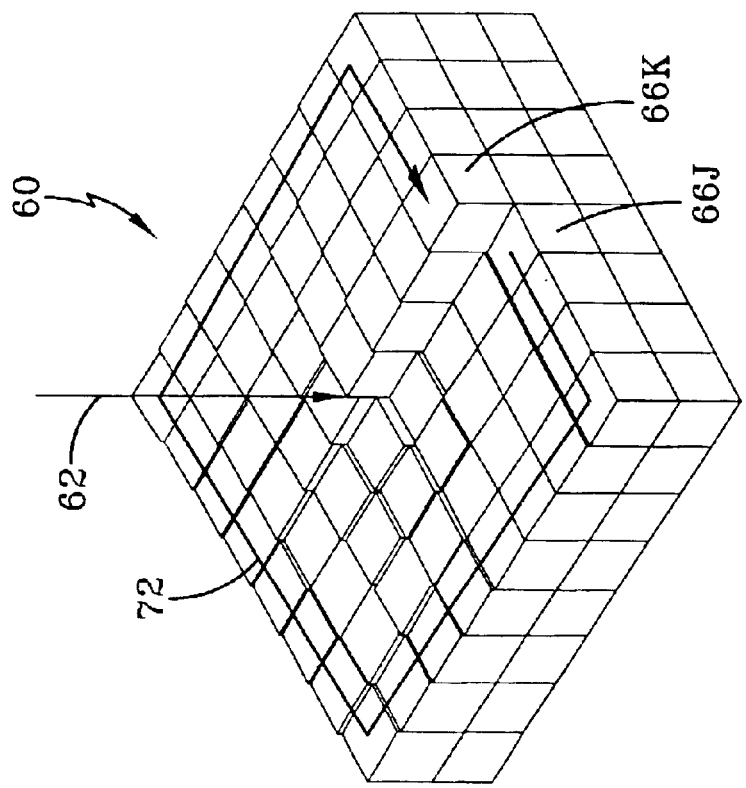

The Burgers vector of a screw dislocation is also well known to those skilled in the art and may be further described with reference to FIGS. 7F and 7G. A Burgers vector of a screw dislocation can be ascertained by horizontally traversing a closed path within the same crystal plane one time completely around the screw dislocation and observing the resulting vertical (i.e., stacking direction) displacement. One such path 72 starting at unit cell 66J and ending at unit cell 66K is depicted in FIG. 7F. Burgers vector of the screw dislocation depicted in FIG. 7F is one unit cell stacking height in magnitude, because the end of the closed surrounding crystal plane path traversal ended up one unit cell above the starting point. Such screw dislocations with Burgers vector equal to one c-axis unit cell height are often referred to as elementary screw dislocations. The Burgers vectors of c-axis screw dislocations are usually integer multiples of the stacking sequence repeat height. Burgers vectors of larger magnitude than the one unit cell height illustrated in FIG. 7F are observed in many different crystals. For example, c-axis screw dislocations with Burgers vector of two, three, four, and other integer heights of the unit cell height are often observed in 4H—SiC and 6H—SiC crystals. The structural properties of 6H—SiC c-axis screw dislocations as a function of the dislocation Burgers vector are described in the previously mentioned technical article "Quantitative Analysis of Screw Dislocations in 6H—SiC Single Crystals" by M. Dudley et al published in the technical journal II Nuovo Cimento, Vol. 19D, No. 2–4, pp 153–164.

In addition to magnitude, a Burgers vector of a screw dislocation, such as screw dislocation 62 of FIG. 7F also has an associated directional sign (also called "sense"). The direction of the screw dislocation Burgers vector depends upon whether or not it takes a clockwise or counterclockwise closed surrounding crystal plane traversal to end up higher in the crystal. The screw dislocation 62 in the small crystal volume 60 depicted in FIG. 7F requires a clockwise closed surrounding crystal plane path traversal 72 to end up in the crystal plane 68 above the starting point, so it is a "left handed" screw dislocation. The screw dislocation 62 in the small crystal volume 60 represented in FIG. 7G requires a counterclockwise closed surrounding crystal plane path traversal 74, so it is a "right handed" screw dislocation.

As discussed in the previously mentioned chapter 11 of the technical book "Semiconductor Interfaces, Microstructures and Devices: Properties and Applications," it is well known that screw dislocations continually provide new growth steps (i.e., act as "growth centers") during crystal growth. This is because there is always a step arising from the discontinuity and spiral nature of the screw dislocation, as depicted in FIG. 7C. The screw dislocation 62 is therefore a structure that self-replicates itself in each subsequently grown crystal layer, so that it propagates through the entire continuous crystal that is grown with increasing thickness along the stacking direction 64. Even if one removes the crystal surrounding the screw dislocation via an etching process, subsequent crystal growth would restore the screw dislocation. Thus, screw dislocations can be classified as "replicating nonremovable stepsource dislocations."

As also discussed in the previously mentioned chapter 11 of the technical book entitled "Semiconductor Interfaces, Microstructures and Devices: Properties and Applications," is that for a screw dislocation 62 to act as a growth center (i.e., continual source of new growth steps), it does not have to be a pure screw dislocation that propagates exactly in the direction of crystallographic stacking 64. The screw dislocation 62 need only have a screw component in order to be a continual source of new growth steps. Thus, other dislocations, such as "mixed" dislocations (known in the art) that contain both screw and other component(s) can also be classified as replicating nonremovable stepsource dislocations during crystal growth. Mixed dislocations often propagate in directions not perfectly parallel to the stacking direction 64.

Because screw dislocations 62 are nonremovable stepsources during crystal growth, avoidance of screw dislocations is necessary in order to gain the benefits of the teachings of U.S. Pat. Nos. 5,915,194 and 6,165,874 and U.S. patent application Ser. No. '998. The teachings of the present invention are directed to such avoidance.

From the above discussion related to FIGS. 7C, 7D, 7E, 7F and 7G, it should now be appreciated that the salient properties of nonremovable stepsource dislocations, such as screw dislocations 62, are three-dimensional in nature. Therefore, it is far from trivial to illustrate all the important behaviors of these dislocations in two-dimensional drawings. However, for purposes of simplicity of illustration, screw dislocations will be represented in a somewhat incomplete, more simplified manner for the remainder of the figures herein. In the remainder of the cross-sectional drawings, the screw dislocation will be simplistically depicted by a simple misalignment of crystal planes 68. While not technically precise, because it does not depict the local stress and 3-D nature of the crystal plane deformation, the simplified representation does accurately represent the fact that local non-alignments in crystal planes occur through the centers of screw dislocations. In planar (i.e., top) view drawings, screw dislocations will be depicted as simple points, consistent with the known structure and propagation of the screw dislocation.

The growth and propagation properties of screw dislocations in various crystals grown by various techniques are discussed in the literature of the art. As discussed previously, screw dislocations in the alpha polytypes of silicon carbide, related to the present invention, have become of particular concern due to the fact that these defects are presently severely limiting the realization of greatly beneficial SiC electronics. In general, these defects propagate (usually parallel, but almost always within 15 degrees of the <0001> crystallographic c-axis of polytypes 4H—SiC and 6H—SiC crystals) and have Burgers vectors that are integer multiples of the c-axis unit repeat height. For 6H—SiC crystals with Burgers vectors two or more times the c-axis unit repeat height (unit repeat height c=1.5 nm for 6H—SiC), the strain at the dislocation becomes too large and is relieved by the crystal forming a hollow core. This phenomenon is discussed in the previously mentioned technical article "Quantitative Analysis of Screw Dislocations in 6H—SiC Single Crystals" by M. Dudley et al published in the technical journal II Nuovo Cimento, Vol. 19D, No. 2–4, pp 153–164. Thus, a micropipe (known in the art) running through a silicon carbide wafer is, in actuality, a large Burgers vector c-axis screw dislocation. The diameter of the hollow core is experimentally observed by Dudley et al., and others, to correlate with the magnitude of the screw dislocation Burgers vector.

Occasionally, dissociation of a micropipe at one point in the crystal into two or more screw dislocations of smaller Burgers vectors at a subsequently grown point in the SiC crystal has been observed. In such cases, the sum of the Burgers vectors of the smaller screw dislocations has been observed to be equal to the Burgers vector of the larger screw dislocation.

Similarly, the convergence of one or more screw dislocations in a growing SiC crystal has also been observed. In all cases, the Burgers vectors of the screw dislocations involved are conserved when screw dislocations combine or dissociate during growth, provided that the crystal structure remains continuous and is not interrupted by a polytype or impurity inclusion.

Thus, when two screw dislocations, equal in magnitude, but opposite in sign coalescence during crystal growth, they annihilate each other so that there is no defect as the remainder of the crystal grows farther along the stacking direction. Unfortunately, this occurrence is both random and relatively rare, as almost all elementary screw dislocations end up propagating entirely through a growing SiC boule. However, the present invention practices this principle to gain the resulting benefits therefrom in a manner to be further described hereinafter.

Figure 8B:
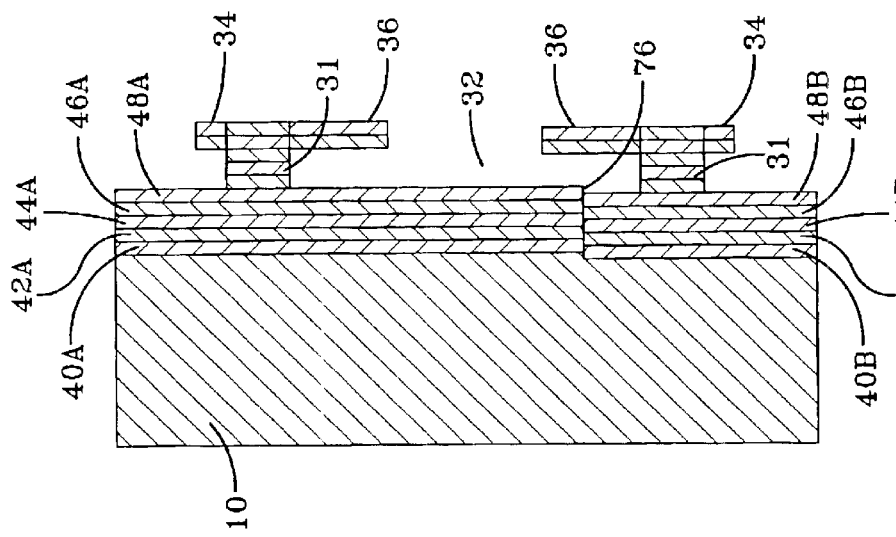
FIG. 8A is a top view thereof and FIG. 8B is a side view taken along line 8B—8B of FIG. 8A and illustrates crystal planes that are disrupted through the middle of a single screw dislocation in the crystal substrate.

The effect of a substrate screw dislocation on the crystal planes of an enclosed hollow mesa shape with incomplete lateral cantilever growth, may be further described with reference to FIG. 8 which is composed of FIGS. 8A and 8B, wherein FIG. 8B is a cross-sectional side view taken along line 8B—8B of FIG. 8A.

Figure 5A:
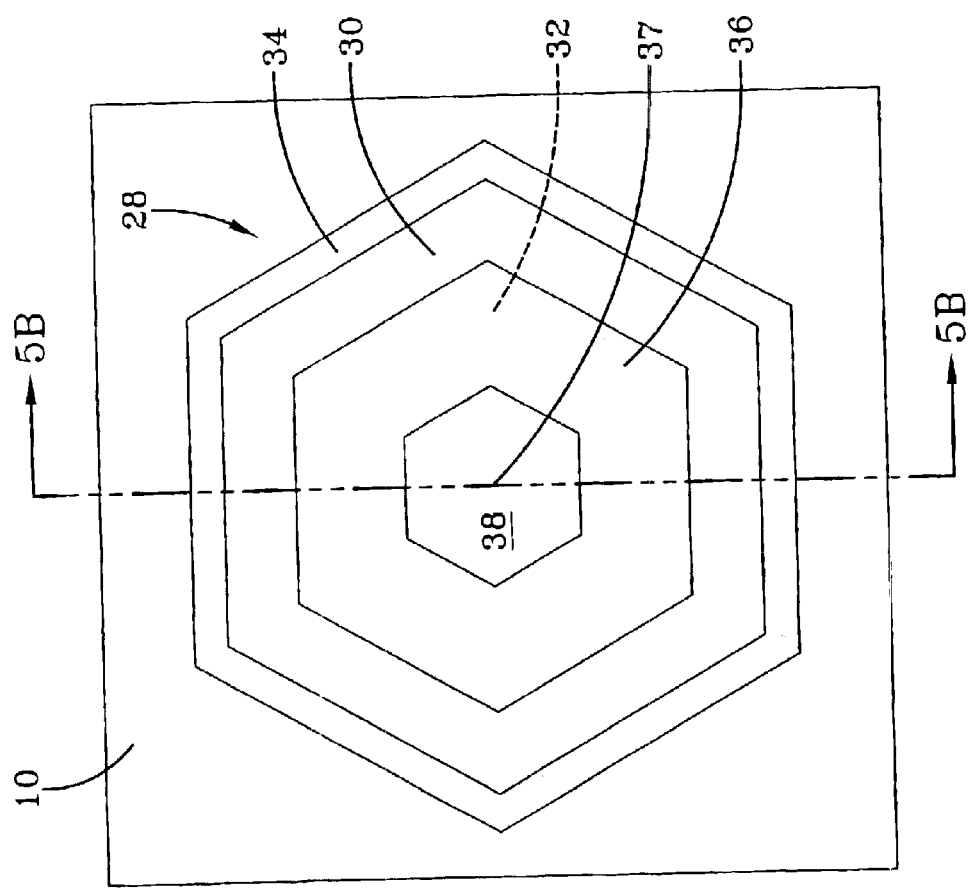
FIG. 5A is a top view thereof.
Figure 8A:
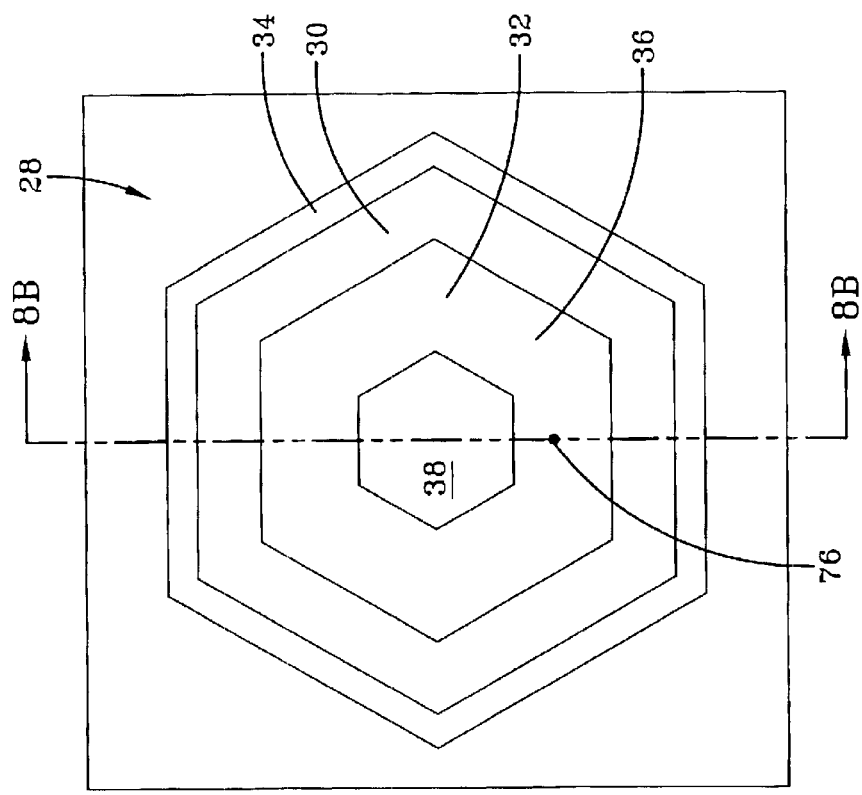

FIG. 8A is quite similar to FIG. 5A, but in addition thereto illustrates an elementary substrate screw dislocation 76, which is also shown in FIG. 8B contained within the hollow region 32 defined by closed pre-growth mesa 28. As seen in FIG. 8B, the substrate screw dislocation 76 causes the crystal planes 40, 42, 44, 46, 48 to FIG. 4 to be offset or displaced relative to each other across the dislocation core so that the planes 40, 42, 44, 46 and 48 are shown in simplified fashion as respectively comprised of non-aligned planes 40A and 40B, 42A and 42B, 44A and 44B, 46A and 46B, and 48A and 48B. Screw dislocations and the associated crystal displacements are more fully described in the previously mentioned technical chapter 11 of "Semiconductor, Interfaces, Microstructures and Devices" and also described previously with respect to FIGS. 7C, 7D, 7E, and 7F.

As seen in FIG. 8B, for example, if there is one substrate screw dislocation 76 that is surrounded by the hollow region 32 of the pre-growth mesa 28, the crystal plane 48 around the support structure 31 will not line up perfectly, that is, the crystal plane 48 at the screw dislocation will become displaced thereby imperfectly forming planes 48A and 48B, as well as causing the imperfect planes 46A and 46B; 44A and 44B; 42A and 42B; and 40A and 40B. Further lateral growth of the structure of FIG. 8 so that the interior cantilevers 36 completely span the enclosed hollow region 32 containing screw dislocation 76 may be further described with reference to FIG. 9 which is composed of FIGS. 9A and 9B, wherein FIG. 9B is a cross-sectional view taken along line 9B—9B of FIG. 9A.

Figure 9B:
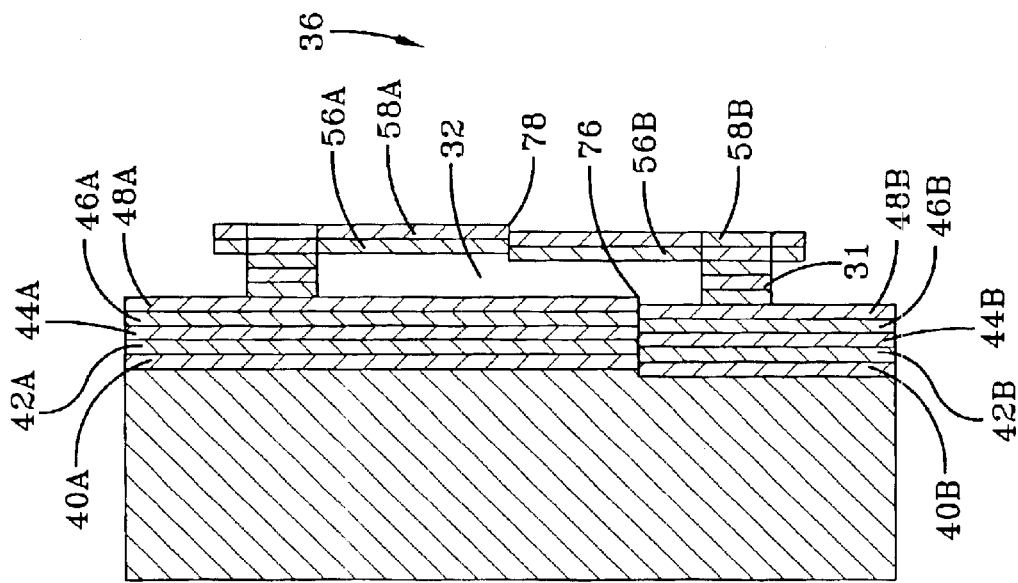
FIG. 9B is a side view, taken along line 9B—9B of FIG. 9A, showing the disruption of the crystal planes through the substrate screw dislocation, as well as the disruption of the crystal planes through the film screw dislocation in the completed webbed roof of the device of FIG. 9.
Figure 9A:
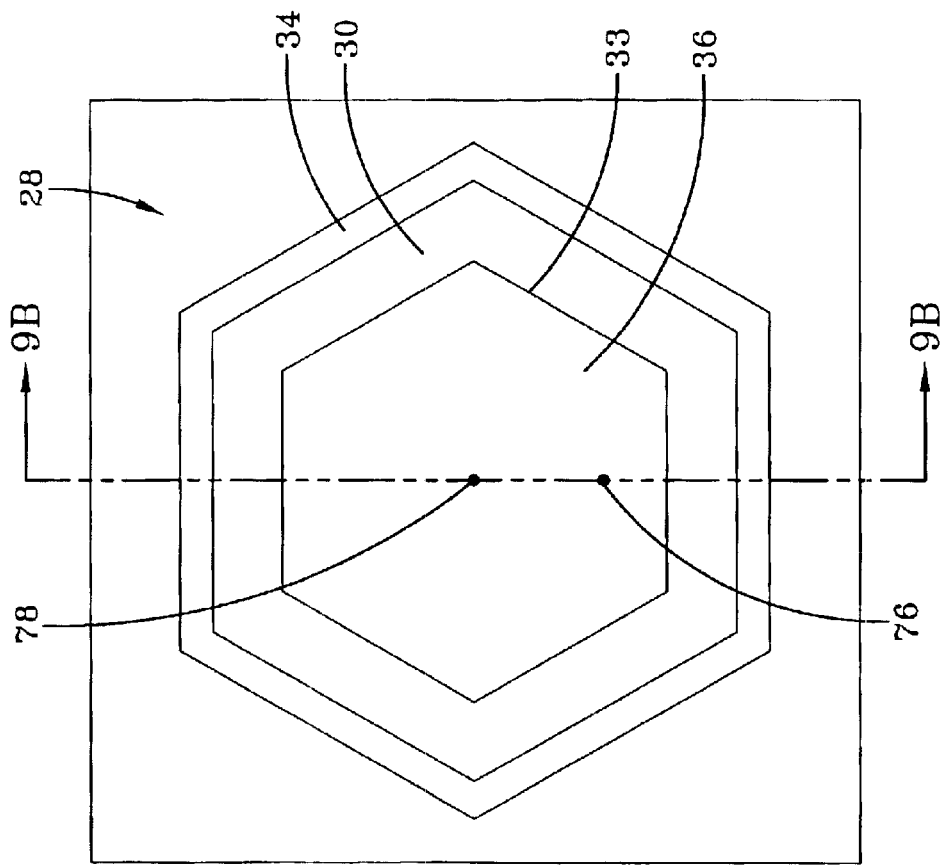
FIG. 9A is a top view slowing substrate screw dislocation and epitaxial film screw dislocation formed upon roof closure at epitaxial lateral film coalescence point related to film web growth.

FIG. 9A is similar to FIG. 7A, except for the presence of substrate screw dislocation 76 resulting in film screw dislocation 78. The screw dislocation 78 associated with the film, such as homoepitaxial being deposited, forms at the convergence point of the webbed roof 36A and is shown in FIG. 9B.

As seen in FIG. 9B, the film screw dislocation 78 is incorporated in the roof 36A exactly at the point of final convergence of the lateral web growth cantilevers contained in region 36. The point of final convergence is predetermined by the interior border shape 33 of the pre-growth mesa 28. For the interior border shape of an equilateral hexagon shown in FIGS. 7A, 8A, and 9A, the predetermined point of final convergence is the geometric center of the equilateral hexagon shape. The point of final convergence occurs at this geometric center location regardless of the original location of the substrate screw dislocation 76 within the interior of the enclosed shape 33. As will be further described hereinafter, the location of the substrate screw dislocation 76 is displaced from a random location anywhere inside to the enclosed interior border shape 33 to the predetermined final coalescence point in the film, in this case the geometric center of the enclosed equilateral hexagon hollow shape 33 of the pre-growth mesa 28. The benefits of the precise placement of the film screw dislocations are to be further described hereinafter with reference to FIGS. 14, 15 and 16. Such beneficial movement of a screw dislocation to a predetermined location in a homoepitaxial film was not possible with prior art processes, even the process of U.S. patent application Ser. No. '998.

When more than one screw dislocation is enclosed within the hollow region 32 of a hollow shaped pre-growth mesa 28, they would both incorporate themselves into the roof at the final coalescence point. What occurs in this case is dependent on Burgers vectors of the enclosed substrate screw dislocations. The Burgers vector of a screw dislocation in the alpha polytypes of SiC is well known and more fully discussed in the previously mentioned chapter 11 of the technical book entitled "Semiconductor Interfaces, Microstructures and Devices: Properties and Applications," and in the technical article by Dudley et al. Crystal dislocation theory indicates that there should be conservation of the screw dislocation Burgers vectors in any crystal of homogeneous polytype. Thus, the Burgers vector of the screw dislocation 78 formed at the center of the web-growth roof in FIG. 9B should have the same magnitude and sign as the initial substrate screw dislocation 76 of FIG. 9A even though it does not occur in the same lateral position. If multiple substrate screw dislocations lie in the interior of the enclosed shaped of the pre-growth mesa 28, crystal dislocation theory suggests and this invention recognizes there will be additive conservation of Burgers vectors (analogous to Kirchoff's law for current flow in any electronic circuit node).

In one embodiment, the present invention provides for the first, second and third growth surfaces similar to that of U.S. patent application Ser. No. '998, but in addition thereto selects the separated second growth surface to have a cumulative hollow region area enclosed by at least one interior border shape selected to obtain lateral coalescence at a selected lateral location, wherein the cumulative hollow region area is selected to be greater than half the inverse of the average density of replicating nonremovable stepsource dislocation in the single crystal substrate 10. The average density of replicating nonremovable stepsource dislocations in the single crystal substrate 10 may be determined by crystal characterization methods known in the art. Commercial SiC wafers have consistently exhibited nonremovable stepsource (i.e., screw) dislocation densities between 5000 to 20,000 per square cm of wafer area.

Figure 10B:
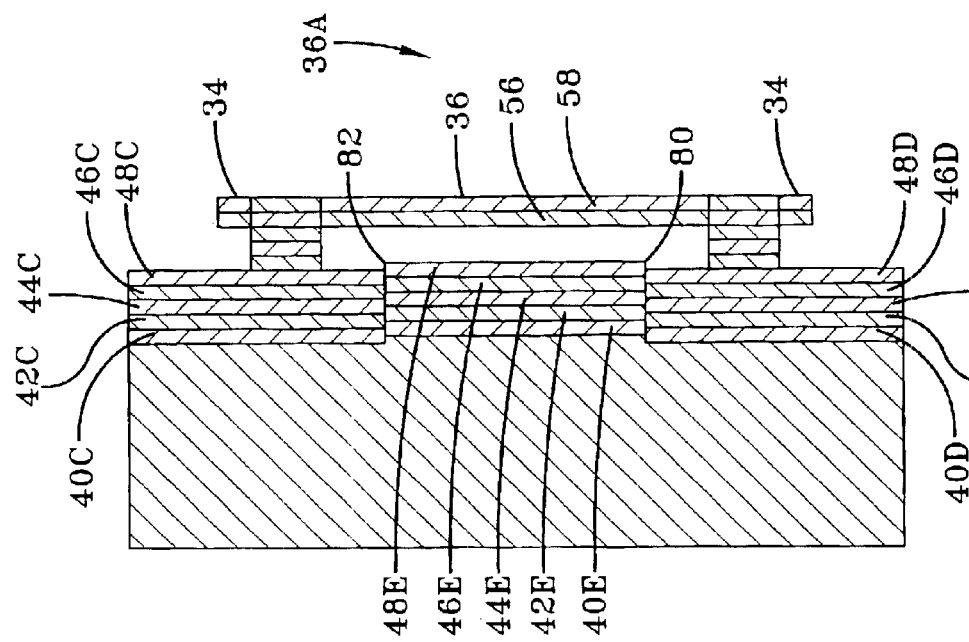
FIG. 10A is a top view thereof and FIG. 10B is a side view thereof, taken along line 10B—10B of FIG. 10A, and illustrates the disruptions of the crystal planes of the substrate of the device of FIG. 10 through the substrate screw dislocations, but non-disruption of the crystal planes of the film.

The presence of multiple screw dislocations, taken into account by the practice of the present invention, may be further described with reference to FIG. 10, which is composed of FIGS. 10A and 10B, wherein FIG. 10B is a cross-sectional view taken along line 10B—10B of FIG. 10A through the centers of the screw dislocations.

Figure 10A:
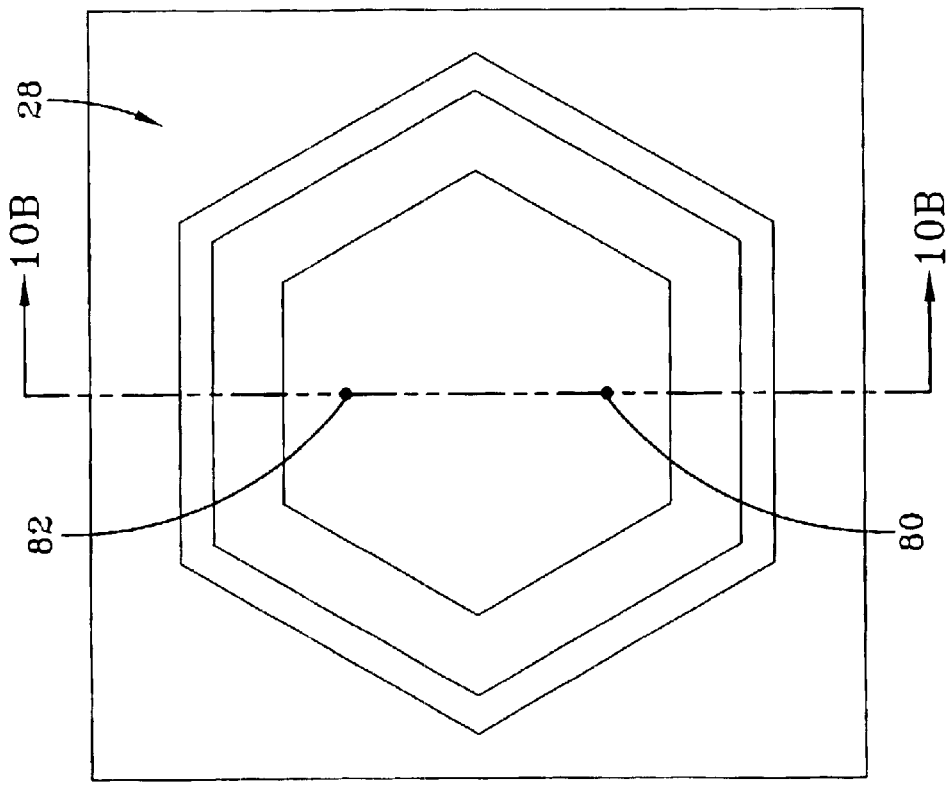

FIG. 10A is similar to FIG. 9A with the exception of the showing of particular types of screw dislocations 80 and 82, wherein screw dislocation 80 is a right-handed elementary screw dislocation and screw dislocation 82 is a left-handed elementary screw dislocation, such as those previously discussed with reference to FIGS. 7F and 7G.

As seen in FIG. 10B, the screw dislocations 80 and 82 cause imperfections in the planes 40, 42, 44, 46, 48. More particularly, the planes 40, 42, 44, 46, 48 are displaced across the cores of substrate screw dislocations 80 and 82. It should be noted that the screw dislocations 80 and 82 are of equal magnitude, but of opposite sign and are enclosed by the hollow interior 32 so that they cancel out each other in the formation of the crystal roof 36A. More particularly, the sum of the Burgers vectors of the screw dislocations 80 and 82 is zero and, thus, there is no screw dislocation formed in the third selected growth surface comprised of the crystal roof 36A.

With reference to FIG. 10B, the screw dislocation that forms, but in the case of FIG. 10B is free therefrom, at the center of the webbed roof 36A of the pre-growth mesa 28 reflects the sum of the Burgers vectors of all the screw dislocations that are enclosed by the hollow region 32 of the pre-growth mesa 28. As seen in FIG. 10B, because this sum is zero, no screw dislocations form in the roof 36A. Therefore, in cases when screw dislocations of equal magnitude, but opposite sign are enclosed in the hollow interior 32 of the enclosed shaped pre-growth mesa 28, they cancel each other out. Thus, for the case depicted in FIG. 10 where two elementary screw dislocations 80 and 82 of opposite signs are enclosed by the hollow shape 32, roof 36A is free of screw dislocations. Hollow regions can enclose numerous elementary screw dislocations of opposite sign. Thus, when these dislocations combine in the roof of the film at the central coalescence point, the film will only contain at most a single screw dislocation. Thus, it should now be appreciated that dislocation density in the film being grown to form the crystal roof 36A is advantageously often lower than in the substrate 10. The condition of screw dislocations not having opposite signs, may be further described with reference to FIG. 11 which is composed of FIGS. 11A and 11B, wherein FIG. 11B is a cross-sectional view taken along line 11B—11B of FIG. 11A.

Figure 11B:
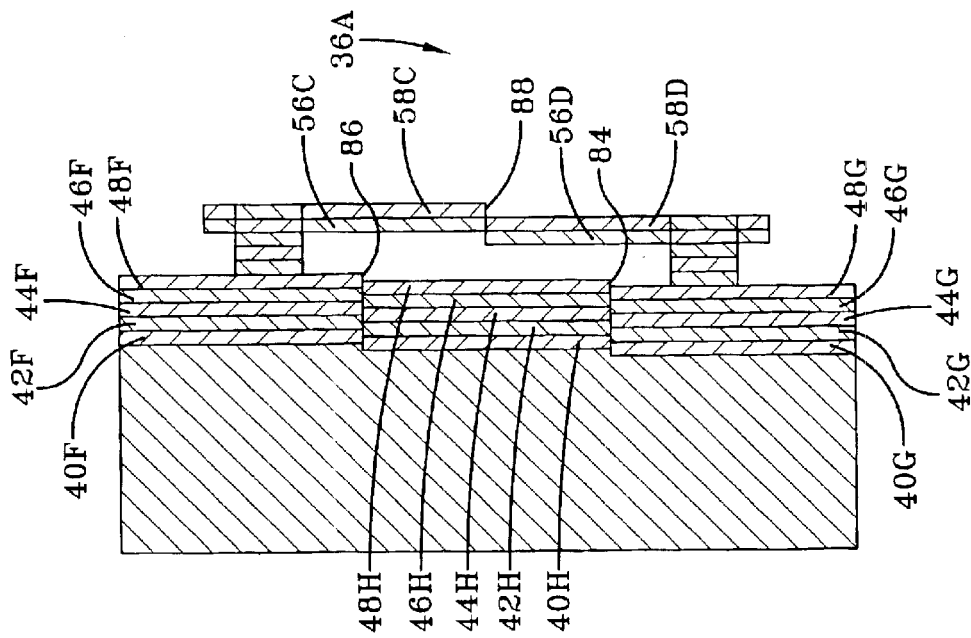
FIG. 11A is a top view thereof and FIG. 11B is a view taken along line 11B—11B of FIG. 11A and illustrates the disruptions of the crystal planes of the substrate and the roof closure of the device of FIG. 11 through the screw dislocations.
Figure 11A:
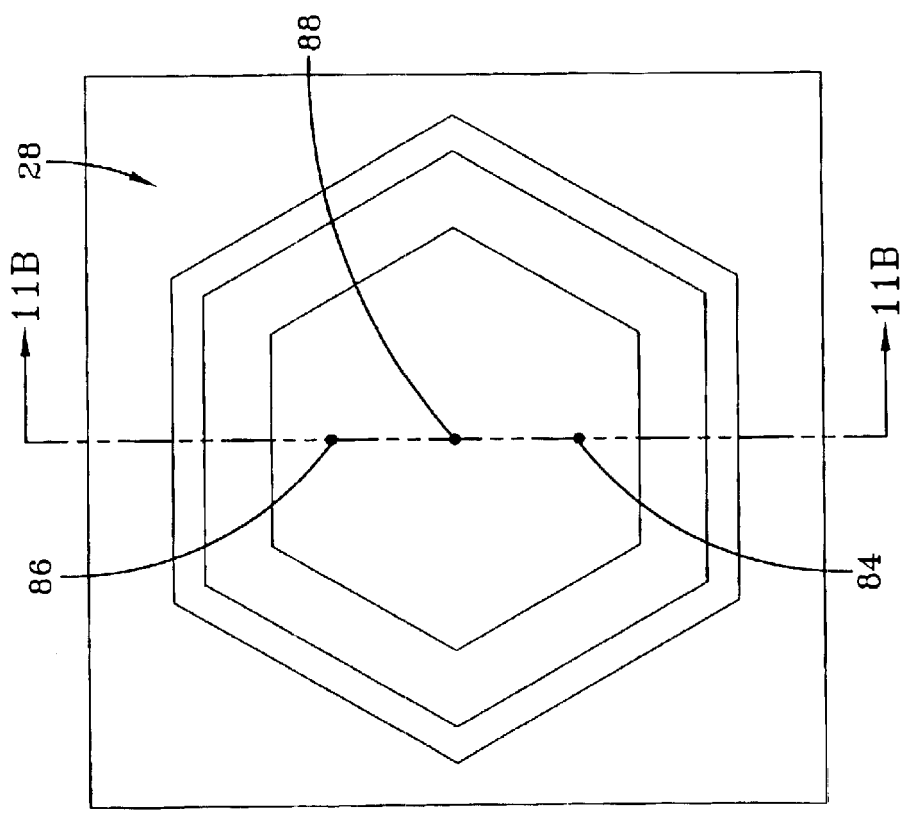

FIG. 11A is quite similar to FIG. 10A with the exception that FIG. 11 shows substrate screw dislocations 84, and 86, which are both right-handed 1c screw dislocations (i.e., elementary screw dislocations).

As seen in FIG. 11B, the substrate screw dislocations 84 and 86 cause the crystal planes 40, 42, 44, 46, and 48 to be imperfect so as to be comprised of imperfect and displaced crystal planes 40F, 40G, 40H; 42F, 42G, 42H; 44F, 44G, 44H; 46F, 46G, 46H; and 48F, 48G, and 48H across the cores of substrate screw dislocations 84 and 86.

As further seen in FIG. 11B, when elementary substrate screw dislocations 84 and 86 of the same sign are enclosed by the enclosed shaped pre-growth mesa 28, in particular hollow interior region 32, as shown in FIG. 1B, a right-handed screw dislocation 88 with Burgers vector 2c forms in the center of the webbed roof 36A that grows to cover the hollow interior 32 of the mesa 28. Similarly, a right-hand screw dislocation 88 causes the perfect cantilevered crystal planes 56 and 58, such as those of FIG. 10B, to become imperfect through the dislocation 88 so as to form respective parts 56C and 56D; and 58C and 58D. Even though the Burgers vector of the film dislocation 88 is larger than each substrate dislocation, the location is now confined to a single lateral point where it is known and can be easily avoided during further device processing. Also, two dislocations 84 and 86 have been combined into a single dislocation 88.

As described in the technical article of Dudley et al, discussed previously, screw dislocations with large Burgers vectors form hollow cores in SiC crystals. In some cases, it is possible, perhaps even probable, that the sum of the Burgers vectors of screw dislocations enclosed by a hollow region 32 is greater than 2c. In such cases of large Burgers vector, the screw dislocation 88 that forms in the crystal roof 36A would form with a hollow core (i.e., a micropipe). The presence of this hollow core, as discussed by Dudley, is due to stress relief in the crystal, and is not due to incomplete coalescence and roof formation. Therefore, as used herein, the description of complete roof formation in the present invention is also meant to include the case where large Burgers vector screw dislocations result in a hole in the crystal roof 36A at the central coalescence point 37 due to hollow core (i.e., micropipe) formation.

It should now be appreciated that regardless of the magnitude of the Burgers vector formed in the roof 36A of the web growth, the location of the screw in the cantilevered crystal roof 36A becomes selected by this invention to be the point of convergence of the lateral growth of the homoepitaxial film in region 36. The cantilevered crystal roof 36A comprises the selected third growth surface related to this embodiment of the present invention that forms semiconductor devices. Thus, devices made possible with this invention can be designed and placed with minimal effort to avoid the predetermined locations of screw dislocations.

For a further consideration of the present invention associated with all embodiments thereof and more fully described in U.S. patent application Ser. No. '998, it is important to prepare the planar first growth surface on single crystal substrate 10 that is parallel to within a predetermined angle, such as 0.1 or 0.2 degrees relative to a selected crystal plane of said single crystal substrate 10. The selected crystal plane may be the basal plane of the single crystal substrate 10. The single crystal substrate 10 has crystallographic directions, as well as a crystallographic c-axis. For hexagonal crystal structure materials, such as 4H—SiC or 6H—SiC, the substrate 10 preferably has selected surface within 1 degree of (0001) basal plane, and mesa shape features aligned along <1$\bar{1}$00> and <11$\bar{2}$0> directions well known to those skilled in the art.

The single crystal substrate 10 may be 15R—SiC (known in the art) and may also be of a crystal selected from the group consisting of 6H—SiC; 4H—SiC; 2H—GaN; 2H—AlN; 2H—Al GaN and 2H—In GaN.

The separated second surface 30, such as the top surface of the pre-growth mesa 28 illustrated in FIG. 4, is selected to provide an interior shape serving as an enclosing border 33, wherein the shape may be any enclosing arrangement, such as a triangle, an equilateral triangle or an equilateral hexagon. FIG. 4A illustrates an equilateral hexagon enclosing arrangement. Each side of the enclosing arrangement is preferably selected to be within 5 degrees of being perpendicular to the <11$\bar{2}$0> or <1$\bar{1}$00> crystallographic direction. Further, the selected lateral location wherein the web convergence of the deposited homoepitaxial film occurs is desired to be at the geometric center of the enclosing arrangement, such as that of an equilateral triangle or equilateral hexagon. In addition, the enclosing arrangement, such as the hexagonal arrangement, may serve as a diaphragm of a sensor device. In addition, for some of the embodiments related to the present invention, it is desired to grow the homoepitaxial film grown on selected single crystal substrate to be of a sufficient size so as to produce at least one large crystal of greater size (i.e., volume) than the single crystal substrate. The large crystal is further processed into one or more crystal wafers and the one or more crystal wafers are employed as seed crystals for production of additional large crystals of greater size than the single crystal substrate. The homoepitaxial film making up the device formed on the single crystal substrate may be further processed into a micromachined (known in the art) device.

It is important to note that this invention can be beneficially applied to more than just substrates of the alpha polytypes of SiC. Recently, there has been tremendous interest and development towards producing single-crystal substrates of the group III-nitride materials, which include the alpha (i.e., hexagonal) polytypes of GaN, AlN, AlGaN, InN, InGaN, for use in wide bandgap electronic applications. As discussed previously, the present invention can be applied with benefits to these materials. However, the dislocation density of these III-N materials should, as is also the case with SiC, be sufficiently low to support practical photolithographic techniques required to define the second growth surface discussed herein.

It has been assumed by the prior art that the distribution of nonremovable stepsource dislocations in the single-crystal substrate are somewhat random, with little or no controlled local variation across the first growth surface. However, to be discussed hereinafter, it should be recognized by some embodiments of the present invention that in some cases, the substrate dislocation densities are not uniform. More particularly, as to be discussed, some processes offer large control of the local variation of nonremovable stepsource dislocations.

It has been extremely challenging in the prior art to produce large III-nitride crystals of acceptably low dislocation density for electronic applications, largely because no large dislocation-free crystals of these materials of these crystals have existed. Some of the most successful methods used to realize lower dislocation density III-nitride crystals to date are disclosed in U.S. Pat. Nos. 6,051,849, 6,255,198, and 6,261,929, herein all incorporated by reference. The methods disclosed in these patents are largely based upon heteroepitaxial growth of III-N layers on a foreign substrate material, such as SiC, sapphire, or silicon. As disclosed in these patents, these efforts are based upon lateral epitaxial overgrowth (LEO) techniques, wherein LEO is inclusive of the "pendeo" epitaxy technique. In some cases, the LEO is carried out homoepitaxially, wherein the lateral crystal growth and the patterned seed region are all the same crystal material, while in other embodiments the LEO technique involves heteroepitaxial growth initiated from a different crystal material than the material produced by the LEO. In either the homoepitaxy or heteroepitaxy LEO case, the present invention can be practiced on top of layers produced by prior art LEO techniques, wherein the top surface of these layers effectively become the first selected growth surface of the present invention.

Many of the drawbacks of LEO techniques relative to cantilevered web growth used by the present invention are discussed in the related U.S. patent application Ser. No. 09/776,998 ('998). In particular, LEO is well known to produce films with surface regions of relatively low crystal dislocation density and regions of relatively high dislocation density. In particular, as discussed in the '998 application, the laterally grown regions are well known to have relatively low dislocation density compared to both "seed regions" and "coalescence regions". While the practicing of double-layer LEO techniques, such as the one illustrated in FIGS. 7 through 14 of U.S. Pat. No. 6,255,198 can largely reduce or eliminate defects over the initial seed regions, the double-layer LEO technique, as well as additional multiple layers, still suffers from the drawback of coalescence defects that form in the regions where LEO lateral cantilevers coalesce, as discussed in the '998 application, as well as other technical references therein.

As discussed in the '998 application, many of the remaining LEO coalescence defects are nonremovable stepsource dislocations, as these defects both act as sources of growth steps and further propagate up the crystallographic c-axis during homoepitaxial growth. The coalescence results in such high defect densities, that the present invention could not be practical if the second growth surface contained regions of coalescence and therefore stepsource defects that would prevent cantilevered web growth from occurring.

Therefore, the surfaces of all prior art LEO III-nitride crystal films have regions of relatively high dislocation density and regions of relatively low dislocation density. Because the LEO process uses well known lateral patterning techniques, the positions of the respective high dislocation density and low dislocation density regions can be selected as part of the LEO process used to prepare a III-nitride crystal film. In particular, the patterns selected to carry out the LEO prior art process could be selected such that they prepare an advantageous first crystal growth surface that would benefit the present invention.

In one embodiment of the present invention, the LEO process can be selected to produce a growth surface (first growth surface of the present invention) that has high dislocation density regions that are islands of high dislocation density, completely surrounded by low dislocation density lateral growth regions. In this case, the selected second growth surface of the present invention could advantageously be patterned (i.e., selected) to reside only in the low dislocation density regions. The present invention could then, for each hollow region defined by the second growth surface, combine all the enclosed nonremovable stepsource dislocations residing in the high dislocation density regions into a single nonremovable stepsource dislocation located at a predetermined lateral point location similar to what is illustrated in FIGS. 8–11. As discussed previously, this predetermined lateral location will only occur with selected interior region border shapes that facilitate final coalescence of lateral cantilevered web growth features at a single final coalescence point location. To the best of our knowledge, nothing in the prior art suggests this combinative result enabled by the present invention.

The LEO patterning and processing necessary to obtain the desired LEO growth surface with island regions of high dislocation density surrounded by low dislocation is not, to the best of our knowledge, specified in the prior art. As described in the '998 application, most of the LEO prior art is of the parallel stripe geometry, which results in extended linear regions of coalescence defects that are not desirably (for the present invention) surrounded by regions good laterally grown material. One embodiment related to LEO patterning that has benefits for practicing the present invention may be further described with reference to FIGS. 12 and 13.

Figure 12:
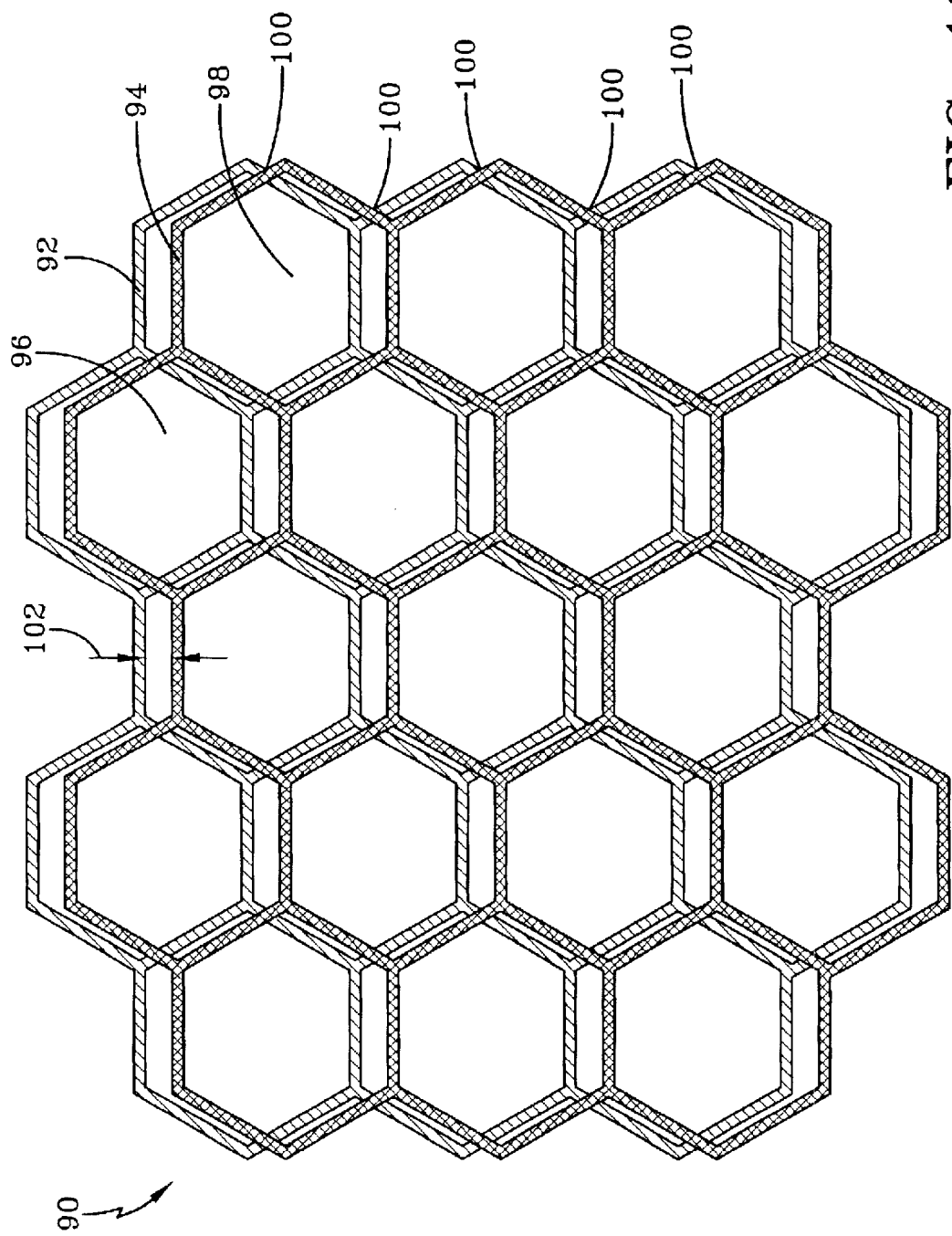
FIG. 12 illustrates a double-layer lateral epitaxial overgrowth (LEO) selective growth seed pattern associated with one embodiment of the present invention.

FIG. 12 depicts double-layer LEO selective growth seed patterns 90 that could be used to produce the desired island regions of high dislocation density surrounded by low dislocation density. The growth seed patterns 90 could preferably be implemented using traditional LEO or pendeoepitaxay. The LEO selective growth seed pattern is comprised of a first layer seed region 92 and a second layer seed region 94 that are used to produce LEO growth regions 96 and 98, respectively. During the first LEO growth material is grown laterally from first seed region 92 to coalesce near the center of hollow enclosed regions 96, thereby confining the LEO coalescence defects to the near center of enclosed regions 96.

Closed hollow region shapes, such as those of region 96 for example, equilateral hexagons in this case, are used so that coalescence defects are confined to small areas near the centers of the hollow regions in a manner as previously described. Other closed shapes besides hexagons, such as triangles or rectangles or squares, could be used, and the two LEO seed regions 92 and 94 for the two LEO growths need not necessarily be defined by the same shape.

Because the film defect density directly over the seed layer 92 is relatively high, the second seed layer pattern 94 is intentionally offset from the first seed layer pattern, provided by layer 92, so that the two seed layers 92 and 94 only overlap in a small area, preferably less than 20% of the total seed region area. A portion of the overlapping area is designated by reference number 100. Where the two seed layers 92 and 94 overlap, the dislocation density in the top film will be high because there is no beneficial laterally grown crystal so that dislocations can propagate vertically without termination in this overlap region. These regions will be islands of high dislocation density crystal, entirely surrounded by laterally grown crystal of lower dislocation density.

The offset, shown in part by distance 102, between the two LEO seed patterns, provided by seed layers 92 and 94, is also selected so that the second seed layer 94 does not reside on the first lateral epitaxial film coalescence regions near the centers of the hexagons formed by the first seed layer 92. Because of the hollow shape of the second seed layer 94, the second LEO film coalesces in a small region near the center of each hexagon formed by the second seed layer 94. This small region of coalescence will also form islands of high dislocation density crystal, entirely surrounded by laterally grown crystal of lower dislocation density. In contrast to the present invention, the LEO coalescence within each hollow region need not necessarily advantageously take place at a single point location within each hollow region, and need not necessarily advantageously result in total combination of all enclosed dislocations to a single dislocation in the overgrown roof in a manner as previously described hereinbefore.

It should now be appreciated that the proper selection of seed window pattern during LEO can provide for desired complete surrounding of high dislocation density material by relatively low dislocation density material desirable for the practice of the present invention. Then, the second growth surface of the present invention may be implemented and applied to avoid the high dislocation density islands as described previously. The implementation of the second growth surface may be further described with reference to FIG. 13.

FIG. 13 is similar to FIG. 12, but in addition thereto, illustrates a second growth surface of the present invention 104, aligned to the two LEO seed window patterns provided by first and second seed layers 92 and 94.

In one embodiment, the hollow regions provided by the first seed layer 92 comprises a crystal planar first growth surface that contains selected plurality of regions that have relatively high nonremovable stepsource dislocation density and at least one selected region that has relatively low nonremovable stepsource dislocation density, wherein the high nonremovable stepsource dislocation density is at least ten (10) times greater than the low nonremovable stepsource dislocation density. The regions of high nonremovable stepsource dislocation density may also comprise an array of high dislocation density island regions, wherein each high dislocation density island region is enclosed by a region of relatively low nonremovable stepsource dislocation density. With reference to FIG. 13, the separated second growth surface 104 is selected to reside 111 entirely within one selected region provided by LEO seed layers 92 and 94 that has relatively low nonremovable stepsource dislocation density. It is preferred that the single crystal substrate material used for this embodiment be a heteroepitaxial layer grown on top of a different crystal material than the single crystal substrate material.

With simultaneous reference to FIGS. 12 and 13, the patterned lateral epitaxial overgrowth (LEO) process that provides the illustrated arrangement is preferably accomplished using a first LEO selective growth region pattern provided by first seed region 92, selected to produce an array of first LEO enclosed hollow regions with cumulative first LEO hollow region area selected to be greater than the area of said first LEO selective growth seed region pattern. More particularly, the area of the hollow regions enclosed by the first seed region 92 is greater than the area occupied by the first seed region 92 by itself. The first LEO enclosed hollow region 96 shapes are selected to obtain a first LEO film coalescence within selected first LEO coalescence regions near the centers of the first hollow regions 96. In another embodiment, a patterned lateral epitaxial overgrowth (LEO) process is accomplished using a second LEO selective growth seed region pattern 94 selected to be an array of second LEO enclosed hollow regions 98 with cumulative second hollow region area selected to be greater than the area of the second selective growth seed region pattern 94 in a manner as described for the first LEO selective growth seed region pattern 92. The second enclosed hollow region 98 shapes are selected to obtain lateral epitaxial overgrowth film coalescence within second selected lateral epitaxial coalescence regions, near the centers of the second hollow regions 98. The pattern overlap, between the first selective growth seed region 92 pattern and second selective growth seed region 94 pattern is selected to be less than 20% of the area of the first selective growth seed region 92, and wherein none of the second selective growth seed region pattern 94 overlaps the first selected lateral epitaxial coalescence regions near the centers of hollow regions 96. In this other embodiment, the selected second growth surface 104 is selected to enclose regions 100 where the first selective growth seed region pattern 92 and the second selective growth seed region 94 overlap, and wherein the second growth surface 104 also encloses the second lateral epitaxial coalescence regions near the centers of hollow regions 98.

The advantages of web growth used in the practice of the present invention for accomplishing rapid formation of thin lateral cantilevers has been discussed previously in this application as well as the U.S. patent application Ser. No. 09/776,998. The preferred embodiment of the present invention relies upon web growth to most rapidly combine and relocate nonremovable stepsource dislocations, such as screw dislocations in the alpha polytypes of SiC, from crystals. In one preferred embodiment, described previously, the screw dislocations enclosed by a hollow region are combined at the point of final roof coalescence. Because the second growth surface is selected to avoid screw dislocations (i.e., is selected to have area less than twice the inverse of the average density of substrate screw dislocations), the lateral growth rate necessary to obtain coalescence is beneficially maximized because there is negligible vertical growth of the crystal in the c-axis direction.

As described previously, the lateral point-coalescence of the roof enabled by proper selection of enclosed hollow region shape is believed crucial to obtaining beneficial combination of screw dislocations contained therein. As described previously with reference to FIGS. 7B, 8B, 9B, 10B, and 11B, it is important to note that the vertical thickness of the webbed roof is actually at least hundreds of unit cell thickness even though the roof schematically represented in simplified fashion for illustration purposes as being only two (2) unit cell planes thick. Yet the vertical misalignment of crystal planes across the centers of the roof screw dislocation in these figures is accurate, being a half-unit cell thickness for the case shown in FIG. 9B and a whole unit-cell thickness for the case shown in FIG. 11B. In reality, the thickness of the actual roof region is not a factor in the vertical alignment/misalignment of crystal planes when final lateral coalescence occurs in the enclosed hollow region. Rather, the vertical alignment/misalignment of crystal planes at the point of lateral roof coalescence is determined solely by the sum of the Burgers vectors of the screw dislocations enclosed by the hollow region, as described previously. Similarly, the relative vertical alignment/misalignment of crystal planes upon lateral film point coalescence does not depend upon the height of the support mesa when proper hollow region shape is used to promote final lateral point coalescence. Furthermore, the vertical alignment/misalignment of crystal planes upon lateral film point coalescence also does not depend upon the presence of screw dislocations contained within the second growth surface when proper hollow region shape is used to promote final lateral coalescence at a single lateral point within each hollow region.

Because screw dislocations can be successfully combined at a single lateral point independent of the vertical film thickness, mesa height, and mesa screw dislocation characteristics, a further method for beneficially using lateral growth from selected hollow shapes to combine screw dislocations can be specified.

In general, a method is provided by the present invention for combining screw dislocations on a selected single crystal substrate having a basal plane, thickness in the direction normal to the basal plane, and an initial first average density of replicating nonremovable stepsource dislocations. The method comprising the steps of: (a) choosing a single crystal substrate material which exhibits a property that the material therein contains a basal plane whereby under selected growth conditions the growth rate due to step-flow growth along the basal plane is greater than at least one hundred (100) times a growth rate due to growth involving two-dimensional nucleation; (b) preparing a planar first growth surface on the single crystal substrate that is parallel to within 10 degrees to the basal plane; (c) removing material in the first growth surface to form holes completely through the single crystal substrate thickness so as to define at least one selected separated second growth surface with border shape selected to have at least one enclosed hollow region with interior border shape selected to obtain lateral coalescence at lateral point and cumulative hollow region area selected greater than half the inverse of said average density of nonremovable stepsource dislocations in said single crystal substrate so as to provide a first average screw dislocation density characteristic. The method further comprises: (d) treating the at least one selected separated growth surface so as to remove any removable sources of unwanted crystal nucleation and any removable sources of growth steps therein; (e) depositing a homoepitaxial film on the separated second growth surface under selected conditions so as to provide a step-flow growth along the basal plane while suppressing two-dimensional nucleation; (f) continuing the deposition of the homoepitaxial film so that the step-flow growth produces lateral growth toward the interior of the at least one enclosed hollow region; and (g) continuing the deposition of the homoepitaxial film until the lateral growth completes lateral coalescence at point within the at least one enclosed hollow region forming a third growth surface with a second average screw dislocation density characteristic that is less than the first average screw dislocation density characteristic. The method preferably further comprises: (h) continuing the deposition of the homoepitaxial film until homoepitaxial film of desired vertical thickness on top of the selected third growth surface is achieved.

The above embodiment provides similar functionality of a previously described embodiment in that it uses selected hollow shapes to provide for subsequent lateral growth and point coalescence needed to advantageously combine the enclosed screw dislocations in a given hollow region into a single screw dislocation. However, in contrast to the previously discussed embodiment, the removal of material by the above embodiment penetrates the entire thickness of the substrate crystal, forming a hole or holes through the entire thickness of the substrate crystal of the selected shape. Furthermore, the second growth surface of the above embodiment may now itself contain nonremovable stepsource dislocations, as its area is not limited by the initial substrate screw dislocation density as was the case for the previously discussed embodiment. The stepsource (i.e., screw) dislocations in the second growth surface provide steps to support vertical epitaxial growth of material up the crystallographic c-axis. Therefore, the above embodiment does not beneficially maximize lateral growth rate as does the previously discussed embodiment. Furthermore, for the above embodiment, the lateral growth rate near a randomly placed screw dislocation in the second growth surface will be less than the lateral growth rate experienced far from any such screw dislocations, so that the exact point of coalescence cannot be exactly specified in the above embodiment as was the case for the previously discussed embodiment. Therefore, the above embodiment does not permit total control of the locations of all screw dislocations as was accomplished in the previously discussed embodiment. Nevertheless, the step-flow growth property of the crystal, wherein step-flow lateral growth parallel to the basal plane is favored over two-dimensional nucleation under selected growth conditions, enables lateral growth, albeit slower and less well-controlled, to laterally coalesce at a lateral point to close up the hollow region. Therefore, nonremovable stepsource dislocations that were in the original substrate within the hollow region can be consolidated, with benefits, by the above embodiment process, provided that proper pre-growth hollow region lateral shape is selected to obtain point-like final lateral film coalescence.

For all embodiments, it is preferred that the single crystal substrate be selected from a group of hexagonal crystal structure materials with (0001) crystallographic basal plane consisting of 6H—SiC; 4H—SiC; 2H—GaN; 2H—AlN; 2H—AlGaN; and 2H—InGaN, and wherein the first growth surface is within 10 degrees of parallel to the (0001) crystallographic basal plane.

An example of one of the devices related to the present invention may be further described to FIG. 14 which is composed of FIGS. 14A and 14B, wherein FIG. 14B is a side view taken along lines 14B—14B of FIG. 14A.

FIG. 14A is a top view of a pn junction diode device 106 comprised of a N SiC layer 108, a P+ SiC layer 110, topside ohmic contact 1112, a predetermined screw dislocation 114, and a deep RIE etch and backside device ohmic contact 116, as shown in FIG. 14B.

The predetermined screw dislocation 114 easily enables the metallurgical pn junction formed by patterned etching of the electrically critical layers 108 and 110 to be free of any screw dislocations.

Although a pn junction diode device 106 is illustrated in the present invention, other devices, such as MOSFET's, thyristors, and IGBT devices, may be practiced by the present invention. The present invention enables better performing high-field SiC devices to be fabricated with higher yield and more simplified processing that was not possible with prior art techniques where all screw dislocations are randomly placed. The practice of the present invention provides technology that could be applied to other crystals with suitable growth properties having existing screw dislocation difficulties. More particularly, depending on a desired device, other hollow shapes, such as hollow squares, and hollow triangles, may be used instead of the hollow hexagon shape described with reference to FIGS. 4–11. For example, the shape could be multiple hollow regions, such as FIG. 15 having six hollow regions defined by a single raised mesa. The arrays of basic shapes could be joined together to form larger device area and/or crystals grown from multiple screw dislocations. In the practice of the present invention, one such shape has been practiced and may be further described with reference to FIG. 15.

FIG. 15 illustrates a webbed growth structure 118 formed on a 4H—SiC mesa and having six hollow equilateral triangle shapes 120A, 120B, 120C, 120D, 120E, and 120F all of which are joined together. The cumulative hollow region area of this structure is the sum of the areas of the six triangles. An AFM analysis was performed on the webbed growth structure 118, which revealed the presence of three elementary screw dislocations, 122A 122B, 122D formed exactly on the respective centers of the equilateral triangles 120A, 120B, and 120D.

The practice of the present invention may be further described with reference to FIG. 16. FIG. 16 shows a graphic representation of an AFM close up of screw dislocation 122B with a left-handed spiral (+1c=1.0 nm Burger vector for 4H—SiC). The AFM analysis was performed using a Digital Instrument Nanoscope with parameters set for a screen size of 10.00 micrometers, a scan rate of 1.001 Hz, number of samples of 256, an image data of height and a data scale of 15.0 nm.

FIG. 16 illustrates an AFM analysis of the elementary (1 nm measured step-height) screw dislocation detected at the center of the webbed roof 122B of FIG. 10B.

It should now be appreciated that the practice of the present invention provides for the ability to relocate the physical lateral locations of substrate screw dislocations so that they can be displaced to predetermined points of webbed growth convergence of epitaxial layers of homoepitaxial films, thereby preventing randomly located screw dislocations from interfering with the epitaxial layers and devices. This enables better performing high-field SiC devices to be fabricated with a high yield that was not possible with prior art processes where screw dislocations were randomly placed. Unlike the prior art, the present invention enables lateral movement of screw dislocations whose lateral locations are random in a substrate to predetermined lateral locations in the epitaxial layer. Also, the invention enables the reduction of the number of screw dislocations that propagate into the epitaxial film.

It should be further appreciated that the present invention having the ability to displace replicating nonremovable stepsource dislocations to desired locations, may select a lateral pattern and an alignment arrangement to locate the no-removable stepsource dislocation to a location that avoids any adverse electrical effects. Further, by having knowledge of the electrical breakdown field of the homoepitaxial film being deposited to make up the semiconductor device, the replicating nonremovable stepsource dislocation may be located so as to be subjected to an operation which is less than 80% of the electrical breakdown field of the deposited homoepitaxial film. Similarly, device can be patterned so that high current densities, in excess of 50% of the maximum device current density, can be confined to regions free of screw dislocations.

The invention has been described with reference to preferred embodiments and alternatives thereof. It is believed that many modifications and alterations to the embodiments as discussed herein, will readily suggest themselves to those skilled in the art upon reading and understanding in detailed description of the invention. It is intended to include all such modifications and alterations insofar as they come within the scope of the present invention.

What we claim is:

1. A method for growing at least one single crystal layer on a selected single crystal substrate having an average density of replicating nonremovable stepsource dislocations, wherein said at least one single crystal layer contains at least one replicating nonremovable stepsource dislocation, confined to selected lateral point locations, said method comprising the steps of:
   a) choosing a single crystal substrate material which exhibits a property that the material therein contains at least one growth plane orientation whereby under selected growth conditions the growth rate due to step-flow growth along the basal plane is greater than at least one hundred (100) times a growth rate perpendicular to the basal plane due to growth involving two-dimensional nucleation;
   b) preparing a planar first growth surface on said single crystal substrate that is parallel to within a predetermined angle relative to a selected crystal plane of said single crystal substrate;
   c) removing material in said first growth surface so as to define at least one selected separated second growth surface with top surface area that is selected to be less than twice the inverse of said average density of replicating nonremovable stepsource dislocations in the said single crystal substrate and with border shape selected to have at least one enclosed hollow region, said selected separated second growth surface defining a cumulative hollow region area enclosed by at least one interior border shape selected to obtain lateral coalescence at said selected lateral point location, wherein said cumulative hollow region area is selected greater than half the inverse of the said average density of replicating nonremovable stepsource dislocations in said single crystal substrate;
   d) treating said at least one selected separated second growth surface so as to remove any removable sources of unwanted crystal nucleation and any removable sources of steps therein;
   e) depositing a homoepitaxial film on said separated second growth surface under selected conditions so as to provide a step-flow growth while suppressing two-dimensional nucleation;
   f) continuing said deposition of said homoepitaxial film so that said step-flow growth results and produces at least one lateral cantilevered web structure growing laterally toward the interior of said at least one enclosed hollow region;
   g) continuing said deposition of said homoepitaxial film until said at least one lateral cantilevered web structure completes its lateral coalescence at said selected lateral location thereby completely covering said at least one enclosed hollow region with at least one complete crystal roof forming at least one selected separated third growth surface of desired size and shape; and
   h) continuing said deposition of said homoepitaxial film until homoepitaxial film of desired vertical thickness on top of said selected separated third growth surface is achieved.

2. The method according to claim 1, wherein vertical epitaxial film growth occurs in the said enclosed hollow region to a vertical hollow region film thickness.

3. The method according to claim 2, wherein said removal of material in step c) is carried out to a vertical depth that exceeds said vertical hollow region film thickness of claim 2.

4. The method according to claim 1, wherein the following step dd) is performed after said step c) of claim 1, but before said step e) of claim 1:
   dd) selectively depositing a growth-inhibiting material of a selected growth-inhibiting film thickness onto regions where material is removed in said step c) of claim 1 without depositing said growth inhibiting material onto said selected separated second growth surface.

5. The method according to claim 4, wherein said removal of material in step c) of claim 1 is carried out to a vertical depth that exceeds said selected growth-inhibiting film thickness.

6. The method according to claim 1, wherein said single crystal substrate has a predetermined volume and wherein said homoepitaxial film of steps e, f, g, and h of claim 1 is grown to sufficient size so as to produce at least one large crystal of a greater volume than that of said single crystal substrate.

7. The method according to claim 6, wherein said at least one large crystal is further processed into one or more crystal wafers.

8. The method according to claim 7, wherein said one or more crystal wafers are employed as seed crystals for production of additional large crystals of greater size than the said single crystal substrate.

9. The method according to claim 1, wherein said homoepitaxial film is further processed into at least one semiconductor device, wherein said homoepitaxial film has a predetermined electrical breakdown field, and wherein said at least one semiconductor device is designed to operate at predetermined current density, wherein the said at least one semiconductor device is selected with a lateral pattern and alignment to avoid adverse electrical effects arising from said at least one replicating nonremovable stepsource dislocation confined to said selected lateral locations.

10. The method according to claim 9, wherein an electrically active region of the said semiconductor device having said lateral pattern and alignment is selected to be devoid of said at least one replicating nonremovable stepsource dislocation confined to said selected lateral locations.

11. The method according to claim 9, wherein said selected lateral pattern and alignment are selected such that an electric field at any of the said replicating nonremovable stepsource dislocations during designed device operation is less than 80% of said electrical breakdown field of the said homoepitaxial film.

12. The method according to claim 9, wherein said selected lateral pattern and alignment are selected such that the density of current flowing through any of the said replicating nonremovable stepsource dislocations during designed device operation is less than 50% of said predetermined device current density.

13. The method according to claim 1, wherein said homoepitaxial film is further processed into at least one micromachined device.

14. The method according to claim 1, wherein said at least one completely coalesced cantilevered web structure completely covering said at least one enclosed hollow region comprises a diaphragm in a sensor device.

15. The method according to claim 1, wherein said single crystal substrate is 15R—SiC, and wherein said selected crystal plane is a (0001) plane of said single crystal substrate and wherein said predetermined angle is less than 10 degrees.

16. The method according to claim 1, wherein said single crystal substrate has a hexagonal crystal structure with <0001>, <1$\bar{1}$00>, and <11$\bar{2}$0> crystallographic directions and crystallographic c-axis, and wherein said selected crystal plane is the (0001) plane and wherein said predetermined angle is less than 10 degrees.

17. The method according to claim 16, wherein said single-crystal substrate is selected from a group of materials consisting of 6H—SiC; 4H—SiC; 2H—GaN; 2H—AlN; 2H—AlGaN; and 2H—InGaN, 2H—InN.

18. The method according to claim 17, wherein said replicating nonremovable stepsource dislocation is a c-axis screw dislocation that replicates during growth along a direction within 15 degrees of parallel to said crystallographic c-axis.

19. The method according to claim 18, wherein said at least one interior border shape is a hexagon, with each side of each said hexagon aligned to within 5 degrees of being perpendicular to a said <1$\bar{1}$00> crystallographic direction.

20. The method according to claim 19, wherein said hexagon is an equilateral hexagon having a geometric center, and wherein said selected lateral location is the geometric center of the said equilateral hexagon having a geometric center.

21. The method according to claim 18, wherein said at least one interior border shape is a hexagon, with each side of each said hexagon aligned to within 5 degrees of being perpendicular to a said <11$\bar{2}$0> crystallographic direction.

22. The method according to claim 18, wherein said interior border shape is a hexagon.

23. The method according to claim 18, wherein said interior border shape is a triangle.

24. The method according to claim 23, wherein said interior border shape forms an equilateral triangle having a geometric center.

25. The method according to claim 24, wherein each side of said equilateral triangle is aligned to within 5 degrees of being perpendicular to a said <1$\bar{1}$00> crystallographic direction, and wherein said selected lateral location is the geometric center of the said equilateral triangle.

26. The method according to claim 24, wherein each side of said equilateral triangle is aligned to within 5 degrees of being perpendicular to a said <11$\bar{2}$0> crystallographic direction, and wherein said selected lateral location is the geometric center of the said equilateral triangle.

27. The method according to claim 1, wherein said selected separated second growth surface contains a plurality of said enclosed hollow regions.

28. The method according to claim 1, wherein said single crystal substrate has a basal plane, and wherein said selected crystal plane is said basal plane.

29. The method according to claim 1, wherein said predetermined angle is less than 1 degree.

30. The method according to claim 29, wherein said single-crystal substrate has a crystallographic c-axis and is comprised of a hexagonal polytype of silicon carbide, and wherein said replicating nonremovable stepsource dislocations are screw dislocations occurring along said crystallographic c-axis of said single-crystal substrate.

31. The method according to claim 30, wherein said step of treating said at least one selected separated second growth surface in said step d) of claim 1 is provided by a gaseous step-flow etch and wherein said step-flow etch is carried out in a suitable growth/etching system at a temperature greater than 1000° C., but less than 2000° C. in a vapor selected from the group of vapors consisting of (1) hydrogen, (2) hydrogen plus hydrogen chloride, (3) and a mix of hydrogen with other gases selected from the group consisting of hydrocarbons, inert gases, and oxygen.

32. The method according to claim 30, wherein said step of treating said at least one selected separated second growth surface in said step d) of claim 1 is provided by a sublimation step-flow etch process and wherein said step-flow etch process is carried out in a growth/etching system at a temperature greater than 1800° C., but less than 2500° C.

33. The method according to claim 30, wherein said homoepitaxial growth is carried out in a suitable crystal growth system that supplies silicon containing growth precursor and carbon containing growth precursor to the said separated second growth surface at a substrate temperature between 1000° C. and 2500° C.

34. The method according to claim 1, wherein said removal of material in step c) of claim 1 is accomplished using a process selected from the group consisting of cutting with a cutting tool, patterned dry etching, patterned wet etching, and laser-based cutting.

35. The method according to claim 1, wherein said single crystal planar first growth surface contains selected plurality of regions that have relatively high nonremovable stepsource dislocation density and at least one selected region that has relatively low nonremovable stepsource dislocation density, wherein said high nonremovable stepsource dislocation density is at least ten (10) times greater than the said low nonremovable stepsource dislocation density.

36. The method according to claim 35, wherein said regions of high nonremovable stepsource dislocation density comprises an array of high dislocation density island regions, wherein each said high dislocation density island region is enclosed by said region of relatively low nonremovable stepsource dislocation density.

37. The method according to claim 36, wherein said selected separated second growth surface is selected to reside substantially entirely within said selected at least one region that has relatively low nonremovable stepsource dislocation density.

38. The method according to claim 37, wherein said single crystal substrate is produced by a patterned lateral epitaxial overgrowth (LEO) process.

39. The method according to claim 38, wherein said single crystal substrate is a heteroepitaxial layer grown on top of a different crystal material than said single crystal substrate material.

40. The method according to claim 38, wherein said patterned lateral epitaxial overgrowth (LEO) process is accomplished using a first LEO selective growth seed region pattern selected to produce an array of first LEO enclosed hollow regions with cumulative first LEO hollow region area selected to be greater than the area of said first LEO selective growth seed region pattern, and wherein said first LEO enclosed hollow region shapes are selected to obtain first LEO film coalescence within selected first LEO coalescence regions.

41. The method according to claim 40, wherein said patterned lateral epitaxial overgrowth (LEO) process is accomplished using a second LEO selective growth seed region pattern selected to be an array of second LEO enclosed hollow regions with cumulative second hollow region area selected to be greater than the area of the said second selective growth seed region pattern, and wherein said second enclosed hollow region shapes are selected to obtain lateral epitaxial overgrowth film coalescence within second selected lateral epitaxial coalescence regions, and wherein the pattern overlap between the said first selective growth seed region pattern and said second selective growth seed region pattern is less than 20% of said area of the said first selective growth seed region, and wherein none of the second selective growth seed region pattern overlaps said first selected lateral epitaxial coalescence regions.

42. The method according to claim 41, wherein said selected second growth surface is selected to enclose regions where said first selective growth seed region pattern and said second selective growth seed region overlap, and wherein said second growth surface also encloses said second lateral epitaxial coalescence regions.

43. The method according to claim 42, wherein said single crystal substrate is selected from the group of hexagonal crystal structure materials with (0001) crystallographic basal plane consisting of 2H—GaN; 2H—AlN; 2H—AlGaN; and 2H—InGaN, wherein said first growth surface is within ten (10) degrees of parallel to the (0001) crystallographic basal plane.

44. A method for combining screw dislocations on a selected single crystal substrate having a basal plane, thickness in the direction normal to the basal plane, and an initial first average density of replicating nonremovable stepsource dislocations, said method comprising the steps of:

(a) choosing a single crystal substrate material which exhibits a property that the material therein contains a basal plane whereby under selected growth conditions the growth rate due to step-flow growth along the basal plane is greater than at least one hundred (100) times a growth rate perpendicular to the basal plane due to growth involving two-dimensional nucleation;

(b) preparing a planar first growth surface on the single crystal substrate that is parallel to within 10 degrees to the basal plane;

(c) removing material in the first growth surface to form holes completely through the single crystal substrate thickness so as to define at least one selected separated second growth surface with border shape selected to have at least one enclosed hollow region with interior border shape selected to obtain lateral coalescence at a lateral point and a cumulative hollow region area selected greater than half the inverse of the said average density of nonremovable stepsource dislocations in said single crystal substrate;

(d) treating said at least one selected separated growth surface so as to remove any removable sources of unwanted crystal nucleation and any removable sources of growth steps therein;

(e) depositing a homoepitaxial film on said separated second growth surface under selected conditions so as to provide a step-flow growth along the basal plane while suppressing two-dimensional nucleation;

(f) continuing said deposition of said homoepitaxial film so that the step-flow growth produces lateral growth toward the interior of said at least one enclosed hollow region; and (g) continuing said deposition of said homoepitaxial film until the lateral growth completes lateral coalescence at point within said at least one enclosed hollow region forming a third growth surface with second average screw dislocation density characteristic that is less than said first average screw dislocation density characteristic.

45. The method according to claim 44, further comprising:

(h) continuing said deposition of said homoepitaxial film until homoepitaxial film of desired vertical thickness on top of the selected third growth surface is achieved.

46. The method according to claim 45, wherein said single crystal substrate has a predetermined volume and wherein said homoepitaxial film is grown to sufficient size so as to produce at least one large crystal of a greater volume than that of said single crystal substrate.

47. The method according to claim 46, wherein said at least one large crystal is further processed into one or more crystal wafers.

48. The method according to claim 47, wherein said one or more crystal wafers are employed as seed crystals for production of additional large crystals of greater size than the said single crystal substrate.

49. The method according to claim 44, wherein said single crystal substrate is 15R—SiC.

50. The method according to claim 44, wherein said single crystal substrate has a hexagonal crystal structure with <0001>, <1$\bar{1}$00>, and <11$\bar{2}$0> crystallographic directions and crystallographic c-axis.

51. The method according to claim 50, wherein said single crystal substrate is selected from a group of materials consisting of 6H—SiC; 4H—SiC; 2H—GaN; 2H—AlN; 2H—AlGaN; and 2H—InGaN, 2H—InN.

52. The method according to claim 51, wherein said replicating nonremovable stepsource dislocation is a c-axis screw dislocation that replicates during growth along a direction within 15 degrees of parallel to said crystallographic c-axis.

53. The method according to claim 52, wherein said at least one interior border shape is a hexagon, with each side of each said hexagon aligned to within 5 degrees of being perpendicular to a said <1$\bar{1}$00> crystallographic direction.

54. The method according to claim 53, wherein said hexagon is an equilateral hexagon having a geometric center.

55. The method according to claim 52, wherein said at least one interior border shape is a hexagon, with each side of each said hexagon aligned to within 5 degrees of being perpendicular to a said <11$\bar{2}$0> crystallographic direction.

56. The method according to claim 52, wherein said interior border shape is a hexagon.

57. The method according to claim 52, wherein said interior border shape is a triangle.

58. The method according to claim 57, wherein said interior border shape forms an equilateral triangle having a geometric center.

59. The method according to claim 58, wherein each side of said equilateral triangle is aligned to within 5 degrees of being perpendicular to a said <1$\bar{1}$00> crystallographic direction.

60. The method according to claim 58, wherein said interior border forms an equilateral triangle and wherein each side of said equilateral triangle is aligned to within 5 degrees of being perpendicular to a said <1$\bar{1}$20> crystallographic direction.

61. The method according to claim 44, wherein said selected separated second growth surface contains a plurality of said enclosed hollow regions.

62. The method according to claim 44, wherein said planar first growth surface is parallel to within 1 degree of the said basal plane.

63. The method according to claim 62, wherein said single-crystal substrate has a crystallographic c-axis and is comprised of a hexagonal polytype of silicon carbide, and wherein said replicating nonremovable stepsource dislocations are screw dislocations occurring along said crystallographic c-axis of said single-crystal substrate.

64. The method according to claim 63, wherein said step of treating said at least one selected separated second growth surface in said step d) of claim 1 is provided by a gaseous step-flow etch and wherein said step-flow etch is carried out in a suitable growth/etching system at a temperature greater than 1000° C., but less than 2000° C. in a vapor selected from the group of vapors consisting of (1) hydrogen, (2) hydrogen plus hydrogen chloride, (3) and a mix of hydrogen with other gases selected from the group consisting of hydrocarbons, inert gases, and oxygen.

65. The method according to claim 63, wherein said step of treating said at least one selected separated second growth surface in said step d) of claim 44 is provided by a sublimation step-flow etch process and wherein said step-flow etch process is carried out in a growth/etching system at a temperature greater than 1800° C., but less than 2500° C.

66. The method according to claim 63, wherein said homoepitaxial growth is carried out in a suitable crystal growth system that supplies silicon containing growth precursor and carbon containing growth precursor to the said separated second growth surface at a substrate temperature between 1000° C. and 2500° C.

67. The method according to claim 44, wherein said removal of material in step c) of claim 44 is accomplished using a process selected from the group consisting of cutting with a cutting tool, patterned dry etching, patterned wet etching, and laser-based cutting.

68. The method according to claim 44, wherein said single crystal planar first growth surface contains selected plurality of regions that have relatively high nonremovable stepsource dislocation density and at least one selected region that has relatively low nonremovable stepsource dislocation density, wherein said high nonremovable stepsource dislocation density is at least ten (10) times greater than said low nonremovable stepsource dislocation density.

69. The method according to claim 68, wherein said regions of high nonremovable stepsource dislocation density comprises an array of high dislocation density island regions, wherein each of said high dislocation density island region is enclosed by said region of relatively low nonremovable stepsource dislocation density.

70. The method according to claim 69, wherein said selected separated second growth surface is selected to reside entirely within said selected at least one region that has relatively low nonremovable stepsource dislocation density.

71. The method according to claim 70, wherein said single crystal substrate is produced by a patterned lateral epitaxial overgrowth (LEO) process.

72. The method according to claim 71, wherein said single-crystal substrate is selected from the group of hexagonal crystal structure materials with (0001) crystallographic basal plane consisting of 2H—GaN; 2H—AlN; 2H—AlGaN; and 2H—InGaN, and wherein said first growth surface is within ten (10) degrees of parallel to the (0001) crystallographic basal plane.

* * * * *